(12) United States Patent
Shih

(10) Patent No.: US 12,740,389 B2
(45) Date of Patent: Sep. 15, 2026

(54) SEMICONDUCTOR DEVICE WITH POLYMER LINER AND METHOD FOR FABRICATING THE SAME

(71) Applicant: NANYA TECHNOLOGY CORPORATION, New Taipei City (TW)

(72) Inventor: Shing-Yih Shih, New Taipei City (TW)

(73) Assignee: NANYA TECHNOLOGY CORPORATION, New Taipei City (TW)

(*) Notice: Subject to any disclaimer, the term of this patent is extended or adjusted under 35 U.S.C. 154(b) by 408 days.

(21) Appl. No.: 18/380,325

(22) Filed: Oct. 16, 2023

(65) Prior Publication Data

US 2024/0234252 A1 Jul. 11, 2024

Related U.S. Application Data

(62) Division of application No. 18/093,900, filed on Jan. 6, 2023, now Pat. No. 12,431,410.

(51) Int. Cl.
*H10W 20/20* (2026.01)
*H10W 20/00* (2026.01)
(Continued)

(52) U.S. Cl.
CPC ......... *H10W 20/20* (2026.01); *H10W 20/023* (2026.01); *H10W 20/039* (2026.01);
(Continued)

(58) Field of Classification Search
CPC . H10W 20/20; H10W 20/023; H10W 20/039; H10W 20/076; H10W 20/425
See application file for complete search history.

(56) References Cited

U.S. PATENT DOCUMENTS 8,247,906 B2 * 8/2012 Law .................... H10W 20/427 257/776
8,716,856 B2 * 5/2014 Tan ...................... H10W 42/00 257/691

(Continued)

FOREIGN PATENT DOCUMENTS

CN 102379037 A * 3/2012 ............ H10W 90/00
CN 102379037 B * 8/2015 ............ H10W 90/00

(Continued)

OTHER PUBLICATIONS

Office Action and and the search report mailed on Jul. 16, 2025 related to U.S. Appl. No. 18/093,900, wherein this application is a DIV of U.S. Appl. No. 18/093,900.

(Continued)

*Primary Examiner* — Laura M Menz
(74) *Attorney, Agent, or Firm* — Xuan Zhang

(57) ABSTRACT

The present disclosure provides a semiconductor device and a manufacturing method of the semiconductor device. The semiconductor device includes: a first substrate, having a front side and a back side opposite to the front side; a first passivation layer over the front side of the first substrate; a second passivation layer over the back side of the first substrate, wherein the second passivation layer has a top surface facing away from the first substrate; a conductive feature disposed in the first passivation layer; a through substrate via penetrating through the second passivation layer and the first substrate; and a polymer liner between a sidewall of the through substrate via and the first substrate.

6 Claims, 27 Drawing Sheets

(51) Int. Cl.

| | |
|---|---|
| ***H10W 20/41*** | (2026.01) |
| ***H10W 20/48*** | (2026.01) |
| ***H10W 90/00*** | (2026.01) |
| *H10W 80/00* | (2026.01) |
| *H10W 90/20* | (2026.01) |

(52) U.S. Cl.

CPC ....... *H10W 20/076* (2026.01); *H10W 20/425* (2026.01); *H10W 20/48* (2026.01); *H10W 90/00* (2026.01); *H10W 80/312* (2026.01); *H10W 80/327* (2026.01); *H10W 90/297* (2026.01); *H10W 90/792* (2026.01)

(56) References Cited

U.S. PATENT DOCUMENTS

| | | | | |
|---|---|---|---|---|
| 9,299,676 | B2 * | 3/2016 | Yu | H10P 14/69433 |
| 9,564,420 | B2 * | 2/2017 | Yu | H10W 20/023 |
| 9,596,768 | B2 * | 3/2017 | We | H05K 1/0306 |
| 10,068,899 | B2 * | 9/2018 | Melville | H10D 88/101 |
| 10,163,756 | B2 * | 12/2018 | Chang | H10P 72/74 |
| 10,510,592 | B2 * | 12/2019 | Kao | H10D 84/038 |
| 10,636,739 | B2 * | 4/2020 | Beyne | H10D 84/0186 |
| 11,043,457 | B2 * | 6/2021 | Alur | H10W 70/05 |
| 11,158,580 | B2 * | 10/2021 | Sio | H10W 20/0234 |
| 12,272,651 | B2 * | 4/2025 | Shih | H10W 70/611 |
| 12,278,190 | B2 * | 4/2025 | Shih | H10W 70/611 |
| 12,354,965 | B2 * | 7/2025 | Shih | H10W 70/65 |
| 12,374,602 | B2 * | 7/2025 | Wang | H10W 20/023 |
| 12,431,410 | B2 * | 9/2025 | Shih | H10W 20/023 |
| 2003/0038344 | A1 * | 2/2003 | Palmer | H01S 5/423 257/E21.597 |
| 2010/0252934 | A1 * | 10/2010 | Law | H10W 20/01 257/E21.597 |
| 2014/0225277 | A1 * | 8/2014 | Chang | H10P 72/74 257/774 |
| 2015/0257282 | A1 * | 9/2015 | We | H05K 1/0306 427/124 |
| 2018/0247832 | A1 * | 8/2018 | Fischer | H01J 37/32174 |
| 2021/0159158 | A1 * | 5/2021 | Chen | H10W 70/095 |
| 2021/0366856 | A1 * | 11/2021 | Kim | H10W 20/023 |
| 2021/0407942 | A1 * | 12/2021 | Yu | H10W 20/0245 |
| 2023/0386909 | A1 * | 11/2023 | Shih | H10W 20/023 |
| 2024/0014048 | A1 * | 1/2024 | Shih | H10W 40/037 |
| 2024/0021527 | A1 * | 1/2024 | Shih | H10W 70/611 |
| 2024/0021528 | A1 * | 1/2024 | Shih | H10W 70/611 |
| 2024/0047395 | A1 * | 2/2024 | Huang | H10W 20/0245 |
| 2024/0153878 | A1 * | 5/2024 | Shih | H10W 70/65 |
| 2024/0153879 | A1 * | 5/2024 | Shih | H10W 70/65 |
| 2024/0153900 | A1 * | 5/2024 | Huang | H10W 72/90 |
| 2024/0153902 | A1 * | 5/2024 | Huang | H10W 72/90 |
| 2024/0234249 | A1 * | 7/2024 | Shih | H10W 20/023 |
| 2024/0234252 | A1 * | 7/2024 | Shih | H10W 20/023 |
| 2024/0349518 | A1 * | 10/2024 | Shih | H10B 80/00 |
| 2024/0349519 | A1 * | 10/2024 | Shih | H10B 80/00 |
| 2025/0105210 | A1 * | 3/2025 | Shih | H10W 72/0198 |
| 2025/0105214 | A1 * | 3/2025 | Shih | H10W 72/0198 |
| 2025/0140646 | A1 * | 5/2025 | Hsu | H10W 20/035 |
| 2025/0140651 | A1 * | 5/2025 | Hsu | H10W 20/035 |
| 2025/0309058 | A1 * | 10/2025 | Shih | H10W 20/023 |

FOREIGN PATENT DOCUMENTS

| | | | | | |
|---|---|---|---|---|---|
| CN | 105140136 | A | * | 12/2015 | H10W 90/00 |
| CN | 106068561 | A | * | 11/2016 | H10W 70/635 |
| CN | 105140136 | B | * | 2/2018 | H10W 90/00 |
| CN | 118315369 | A | * | 7/2024 | H10W 20/0265 |
| CN | 119920797 | A | * | 5/2025 | H10W 90/00 |
| CN | 119920799 | A | * | 5/2025 | H10W 90/00 |
| DE | 102015120879 | A1 | * | 6/2017 | H01M 4/0426 |
| JP | H0220531 | A | * | 1/1990 | |
| JP | 2002513511 | A | * | 5/2002 | H01L 43/02 |
| JP | 2015173256 | A | * | 10/2015 | H10P 50/283 |
| JP | 2017509154 | A | * | 3/2017 | H10W 70/635 |
| JP | 2018152616 | A | * | 9/2018 | H10W 70/635 |
| KR | 20130057314 | A | * | 5/2013 | H05K 3/3452 |
| TW | 1826325 | B | * | 12/2023 | H10W 20/0265 |
| TW | I826325 | B | | 12/2023 | |
| TW | 202429587 | A | * | 7/2024 | H10W 20/0265 |
| TW | 1871883 | B | * | 2/2025 | H10W 90/00 |
| TW | I871883 | B | | 2/2025 | |
| TW | 202520503 | A | * | 5/2025 | H10W 90/00 |
| TW | 202520505 | A | * | 5/2025 | H10W 90/00 |
| WO | WO-2015134279 | A1 | * | 9/2015 | H10W 70/635 |

OTHER PUBLICATIONS

English abstract of the foreign patent documents related to U.S. Appl. No. 18/093,900.

* cited by examiner

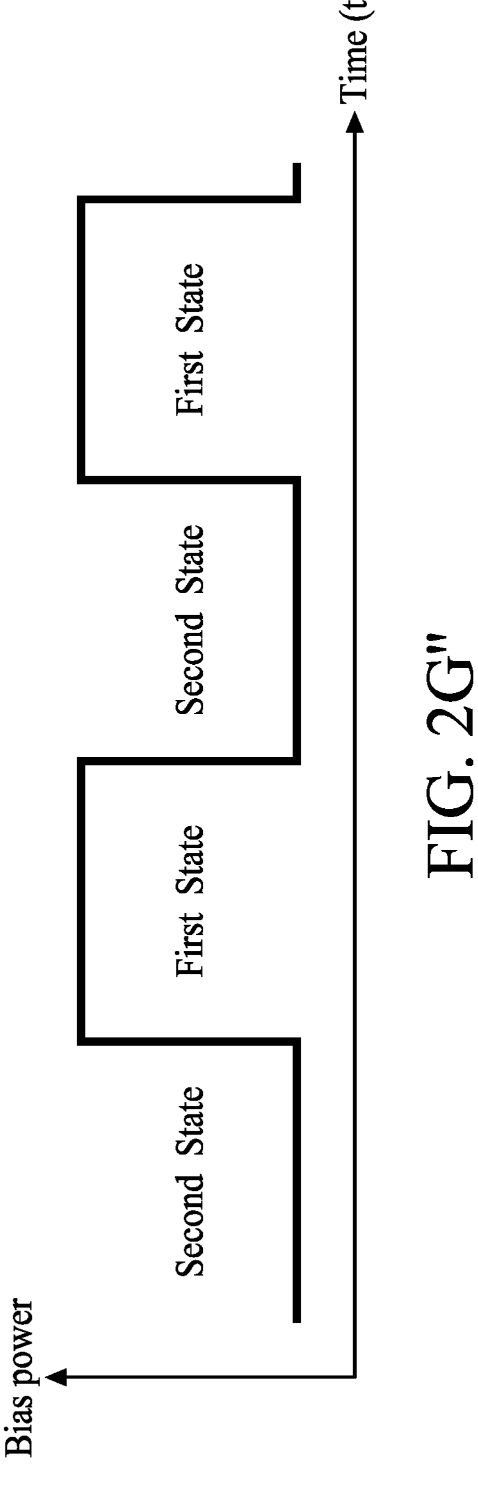
FIG. 2G"

SEMICONDUCTOR DEVICE WITH POLYMER LINER AND METHOD FOR FABRICATING THE SAME

CROSS-REFERENCE TO RELATED APPLICATION

This application is a divisional application of U.S. Non-Provisional application Ser. No. 18/093,900 filed Jan. 6, 2023, which is incorporated herein by reference in its entirety.

TECHNICAL FIELD

The present disclosure relates to a semiconductor device and a method for fabricating the semiconductor device, and more particularly, to a semiconductor device with a polymer liner and a method for fabricating the semiconductor device with the polymer liner.

DISCUSSION OF THE BACKGROUND

Semiconductor devices are used in a variety of electronic applications, such as personal computers, cellular phones, digital cameras, and other electronic equipment. As the semiconductor industry has progressed into advanced technology process nodes in pursuit of greater device density, higher performance, and lower costs, challenges of facilitating integration of components with different sizes and complex features have arisen, especially for multi-stack structure devices.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a first substrate, having a front side and a back side opposite to the front side; a first passivation layer over the front side of the first substrate; a second passivation layer over the back side of the first substrate, wherein the second passivation layer has a top surface facing away from the first substrate; a conductive feature disposed in the first passivation layer, wherein the conductive feature includes a conductive pad and an interconnect structure electrically connected to the conductive pad; a through substrate via (TSV) penetrating through the second passivation layer and the first substrate, wherein the TSV is electrically coupled to the conductive feature; and a polymer liner between a sidewall of the TSV and the first substrate, wherein a top surface of the polymer liner is lower than the top surface of the second passivation layer.

Another aspect of the present disclosure provides a semiconductor device including a first semiconductor chip, the first semiconductor chip including a first substrate having a front side and a back side opposite to the front side; a first passivation layer over the front side of the first substrate; a second passivation layer over the back side of the first substrate, wherein the second passivation layer has a top surface facing away from the first substrate; a conductive feature disposed in the first passivation layer, wherein the conductive feature includes a conductive pad and an interconnect structure electrically connected to the conductive pad; a through substrate via (TSV) exposed through the second passivation layer, wherein the TSV is electrically coupled to the conductive feature; a polymer liner between a sidewall of the TSV and the first substrate; and a second semiconductor chip coupled to the first semiconductor chip at a bonding interface, the second semiconductor chip including: a second substrate coupled to the first substrate, wherein the polymer liner of the first semiconductor chip is separate from the bonding interface.

Another aspect of the present disclosure provides a method for fabricating a semiconductor device including forming a conductive feature in a first passivation layer over a front side of a first substrate; forming a second passivation layer over a back side of the first substrate; forming a first recess in a top surface of the second passivation layer to expose the conductive feature; performing a pulsed etching operation to form a polymer liner in the first recess, wherein a top surface of the polymer liner is lower than a top surface of the second passivation layer; and forming a conductive material in the first recess to form a through substrate via.

In pursuit of greater device density, a distance between two adjacent conductive vias (such as two through substrate vias) becomes smaller and smaller. As a result, electrical interference may occur and thereby decrease device performance. Further, through substrate vias with smaller dimensions may face reliability issues. For example, a stress concentration issue may cause defects in a device. In addition, it is important to improve a yield of hybrid bonding.

A design of the semiconductor device discussed in the present disclosure, as well as a fabrication method thereof, aim to address the aforesaid issues. Particularly, the present disclosure provides a semiconductor device with a polymer liner and a method of forming the semiconductor device with the polymer liner.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

FIG. 2D' is an enlarged schematic diagram of a dotted region A1 shown in FIG. 2D in accordance with some embodiments of the present disclosure.

FIG. 2F' is an enlarged schematic diagram of a dotted region A2 shown in FIG. 2F in accordance with some embodiments of the present disclosure.

FIG. 2G' shows a bias power-time diagram of a pulsed etching operation in accordance with some embodiments of the present disclosure.

FIG. 2G" shows a bias power-time diagram of a pulsed etching operation in accordance with different embodiments of the present disclosure.

DETAILED DESCRIPTION

Figure 1:
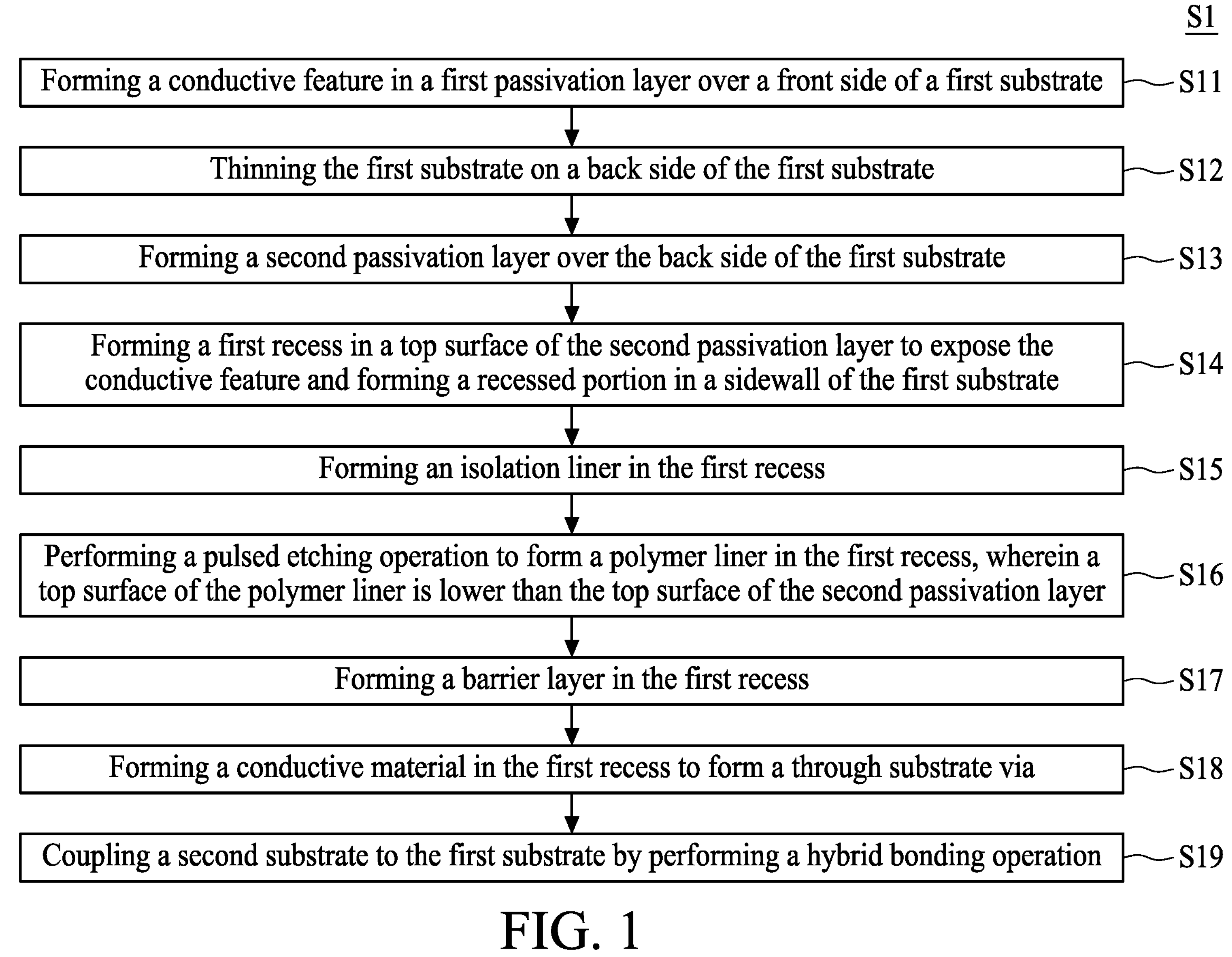
FIG. 1 is a flow diagram illustrating a method of manufacturing a semiconductor device in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms “a,” “an” and “the” are intended to include the plural forms as well, unless the context clearly indicates otherwise. It shall be understood that the terms “comprises” and “comprising,” when used in this specification, point out the presence of stated features, integers, steps, operations, elements, or components, but do not preclude the presence or addition of one or more other features, integers, steps, operations, elements, components, or groups thereof.

In pursuit of greater device density, a distance between two adjacent conductive vias (such as two through substrate vias, TSVs) becomes smaller and smaller. As a result, electrical interference may occur and thereby decrease device performance. Further, through substrate vias with smaller dimensions may face reliability issues. For example, a stress concentration issue may cause defects or anomalies in a semiconductor device. In addition, it is important to improve a yield of hybrid bonding.

Particularly, the present disclosure provides a semiconductor device with a polymer liner and a method for forming the semiconductor device with the polymer liner. Performance of a device formed according to the method and a product yield of the device can both be improved. For example, electrical interference may be alleviated, reliability of through substrate vias can be improved, and the yield of hybrid bonding can be improved.

FIG. 1 is a flow diagram illustrating a method S1 of manufacturing a semiconductor device in accordance with some embodiments of the present disclosure. The method S1 includes a number of operations (S11, S12, S13, S14, S15, S16, S17, S18, and S19) and the description and illustration are not deemed as a limitation to the sequence of the operations. In the operation S11, a conductive feature is formed in a first passivation layer over a front side of a first substrate. In the operation S12, the first substrate is thinned on a back side of the first substrate. In the operation S13, a second passivation layer is formed over the back side of the first substrate. In the operation S14, a first recess is formed in a top surface of the second passivation layer to expose the conductive feature, and a recessed portion is formed in a sidewall of the first substrate. In the operation S15, an isolation liner is formed in the first recess. In the operation S16, a pulsed etching operation is performed to form a polymer liner in the first recess, wherein a top surface of the polymer liner is lower than the top surface of the second passivation layer. In the operation S17, a barrier layer is formed in the first recess. In the operation S18, a conductive material is formed in the first recess to form a through substrate via (TSV). In the operation S19, a second substrate is coupled to the first substrate by performing a hybrid bonding operation.

FIGS. 2A to 2L are schematic diagrams illustrating various fabrication stages constructed according to the method S1 in accordance with some embodiments of the present disclosure. FIG. 2M, FIG. 2N and FIG. 3 are schematic diagrams illustrating various devices that may be fabricated by performing operations of the method S1.

Figure 2A:
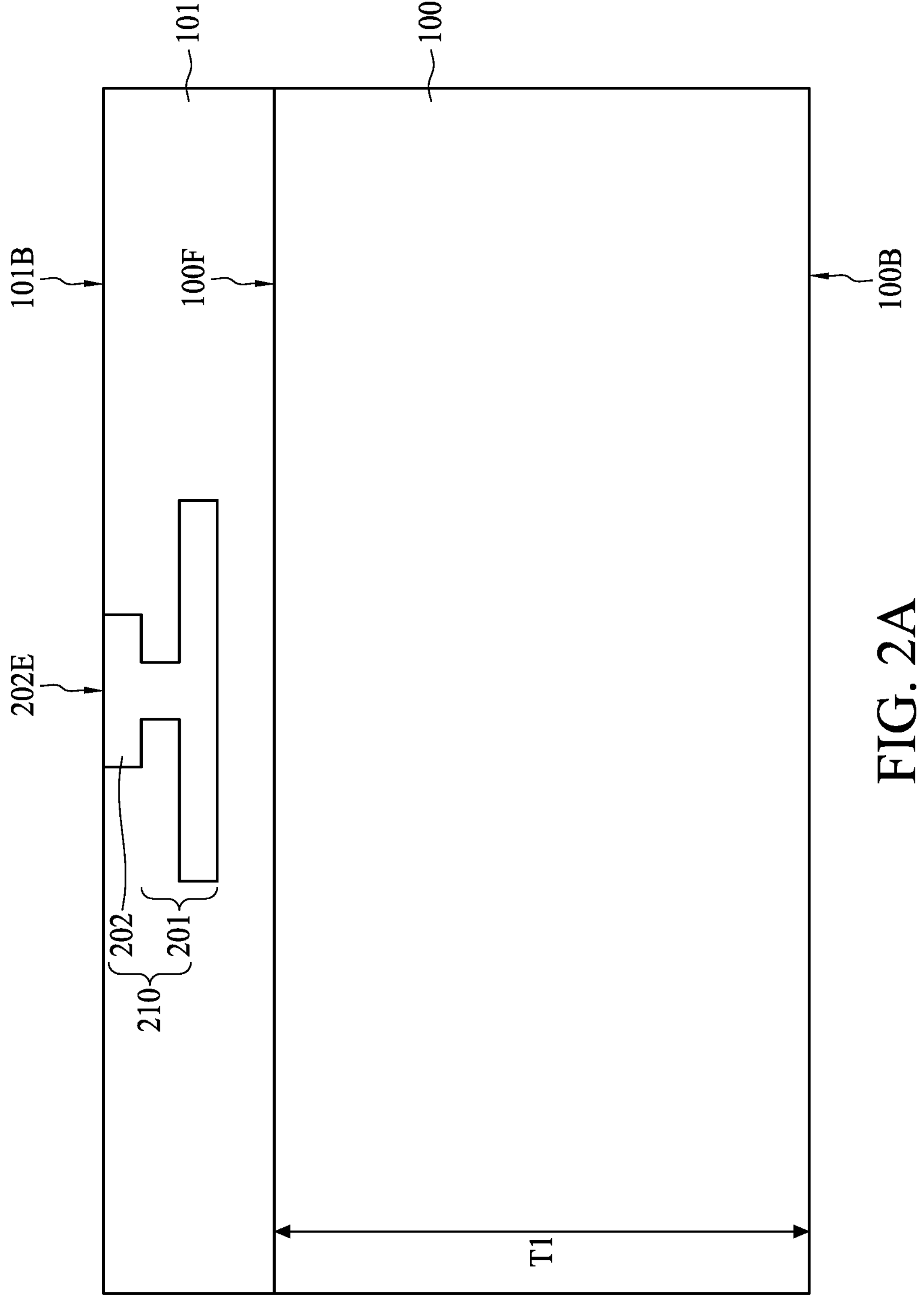
FIGS. 2A to 2D are cross-sectional diagrams of intermediate stages in the formation of a semiconductor device in accordance with some embodiments of the present disclosure.
Figure 3:
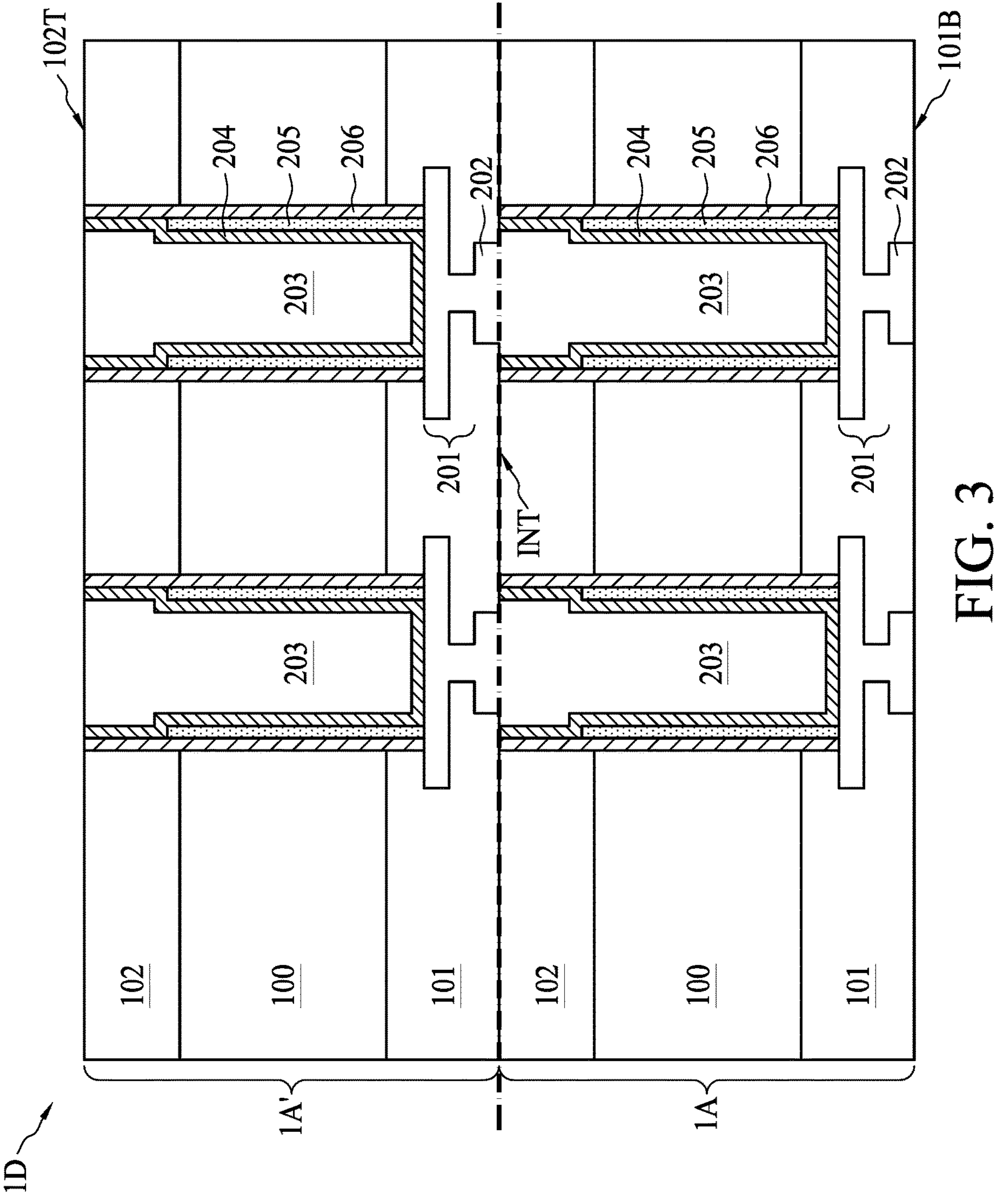

FIG. 2A is a cross-sectional diagram of an intermediate stage in the formation of a semiconductor device in accordance with some embodiments of the present disclosure. Prior to the operation S11, a first substrate 100 with a first thickness T1 is provided, received, or formed. The first substrate 100 has a front side 100F and a back side 100B opposite to the front side 100F. A first passivation layer 101 is formed over the front side 100F of the first substrate 100. In the operation S11, a conductive feature 210 is formed in the first passivation layer 101 over the front side 100F of the first substrate 100. In some embodiments, the conductive feature 210 includes a conductive pad 202 exposed through a back side 101B of the first passivation layer 101, and an interconnect structure 201 electrically connected to the conductive pad 202. The conductive pad 202 and the interconnect structure 201 may be made of conductive materials, such as copper, aluminum copper, other types of metal, or other suitable materials. In some embodiments, a planarization operation, such as a chemical mechanical planarization (CMP) operation, can be performed in the operation S11 over the first passivation layer 101, thus causing an exposed surface 202E of the conductive pad 202 to be coplanar with the back side 101B of the first passivation layer 101.

The first substrate 100 may be a semiconductor substrate, such as a bulk semiconductor, a semiconductor-on-insulator (SOI) substrate, or the like. The first substrate 100 can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable materials; or a combination thereof. In some embodiments, the alloy semiconductor substrate may be a SiGe alloy with a gradient SiGe feature in which Si and Ge compositions change from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy.

In some embodiments, the first substrate 100 may have a multilayer structure, or the first substrate 100 may include a multilayer compound semiconductor structure. In some embodiments, the first substrate 100 includes semiconductor devices, electrical components, electrical elements or a combination thereof. In some embodiments, the first substrate 100 includes transistors or functional units of transistors.

In some embodiments, the first passivation layer 101 includes insulation materials, for example, SiON, $SiO_2$, SiCN, silicon-based material, nitride-based material, oxide-based material, carbide-based material, a combination thereof, or other suitable materials.

Figure 2B:
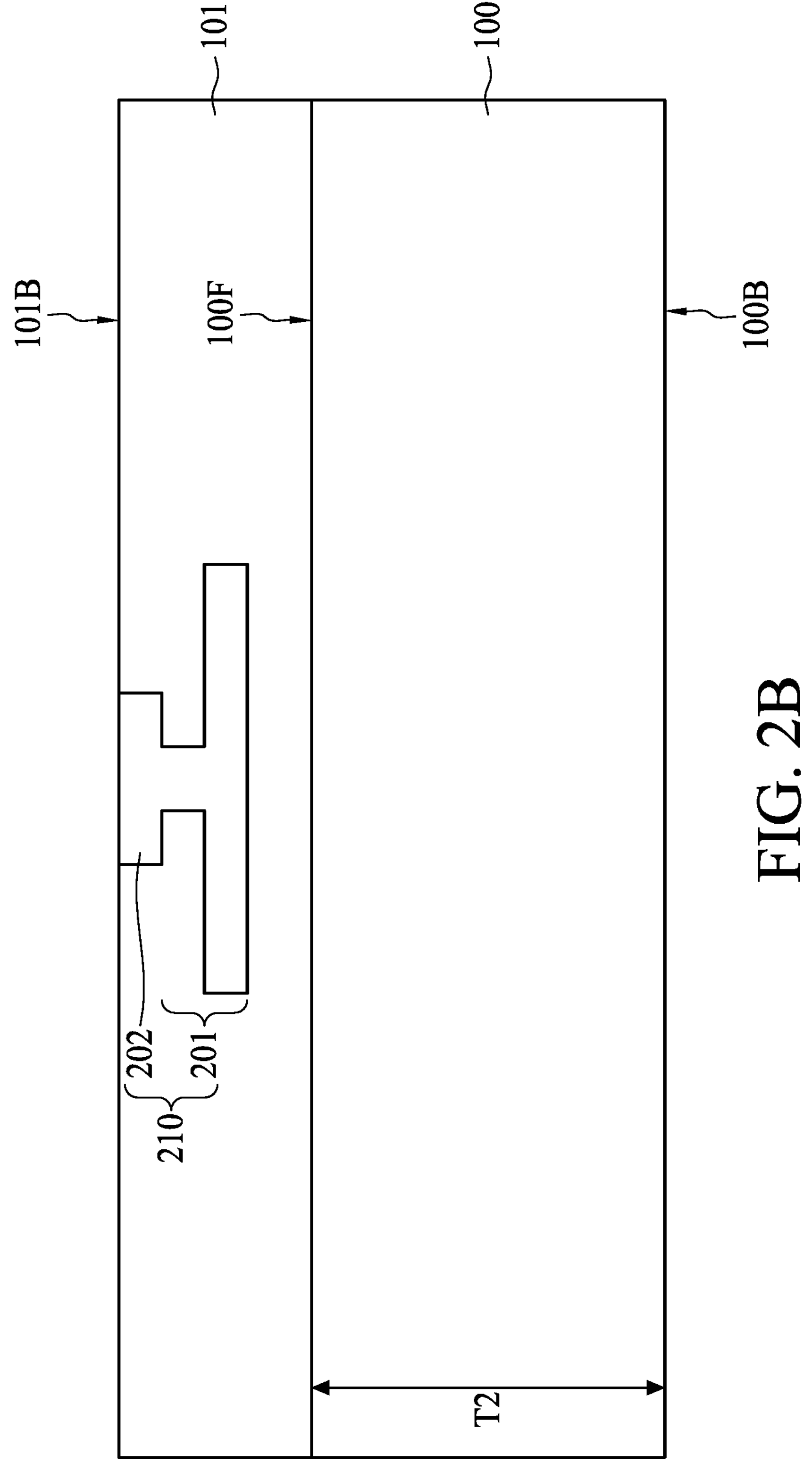

FIG. 2B is a cross-sectional diagram of an intermediate stage in the formation of a semiconductor device in accordance with some embodiments of the present disclosure. In the operation S12, a thinning operation is performed on the back side 100B of the first substrate 100. For example, a thickness of the first substrate 100 is decreased from a first thickness T1 (shown in FIG. 2A) to a second thickness T2, wherein the second thickness T2 is less than the first thickness T1. In some embodiments, the thinning operation of the operation S12 includes grinding on the back side 100B of the first substrate 100.

Figure 2C:
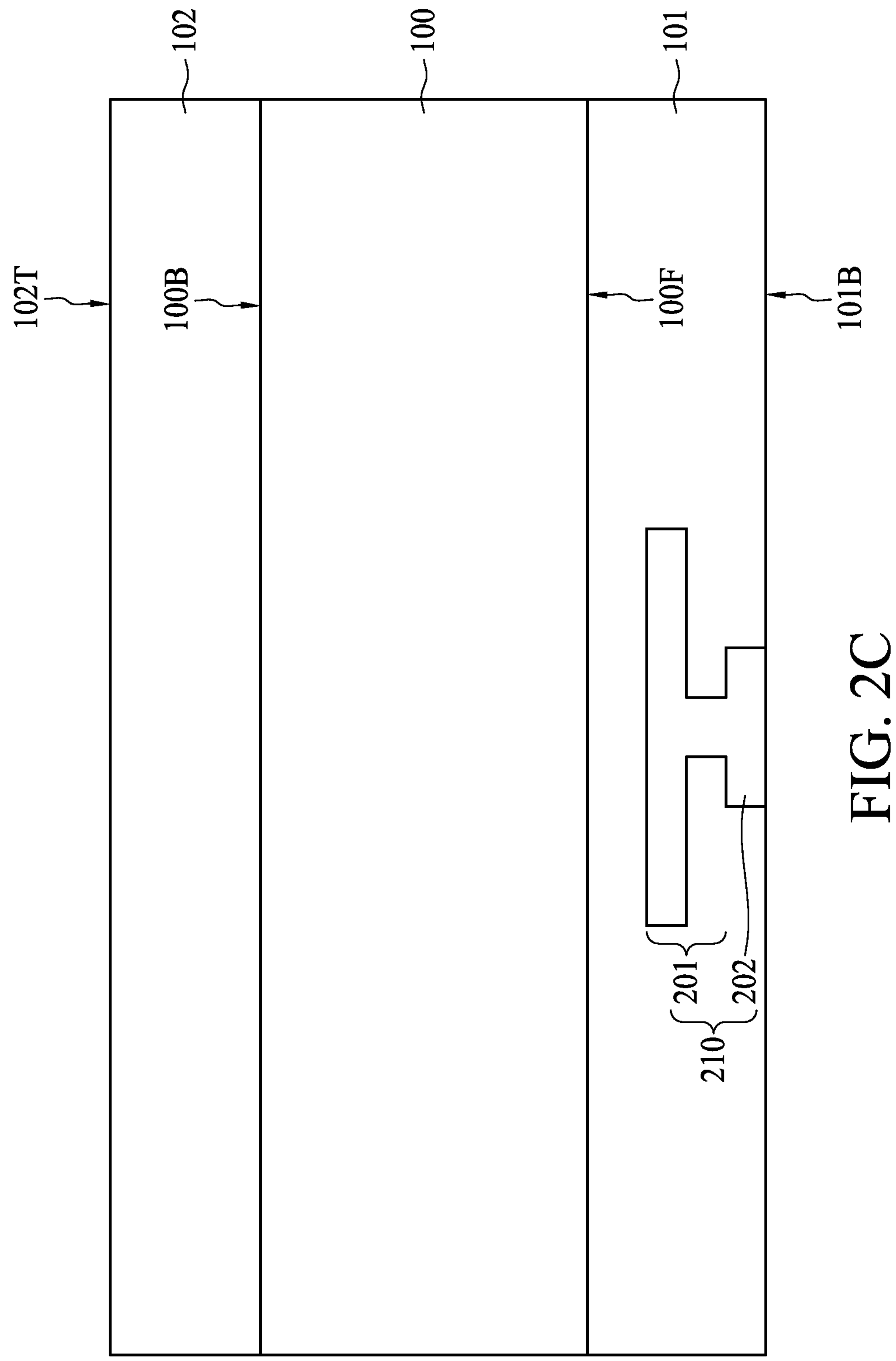

FIG. 2C is a cross-sectional diagram of an intermediate stage in the formation of a semiconductor device in accordance with some embodiments of the present disclosure. In the operation S13, a second passivation layer 102 is formed over the back side 100B of the first substrate 100. The second passivation layer 102 has a top surface 102T facing away from the first substrate 100. In some embodiments, the second passivation layer 102 includes insulation materials, for example, SiON, $SiO_2$, SiCN, silicon-based material, nitride-based material, oxide-based material, carbide-based material, a combination thereof, or other suitable materials. In some embodiments, the first substrate 100 is flipped prior to the operation S13.

Figure 2D:
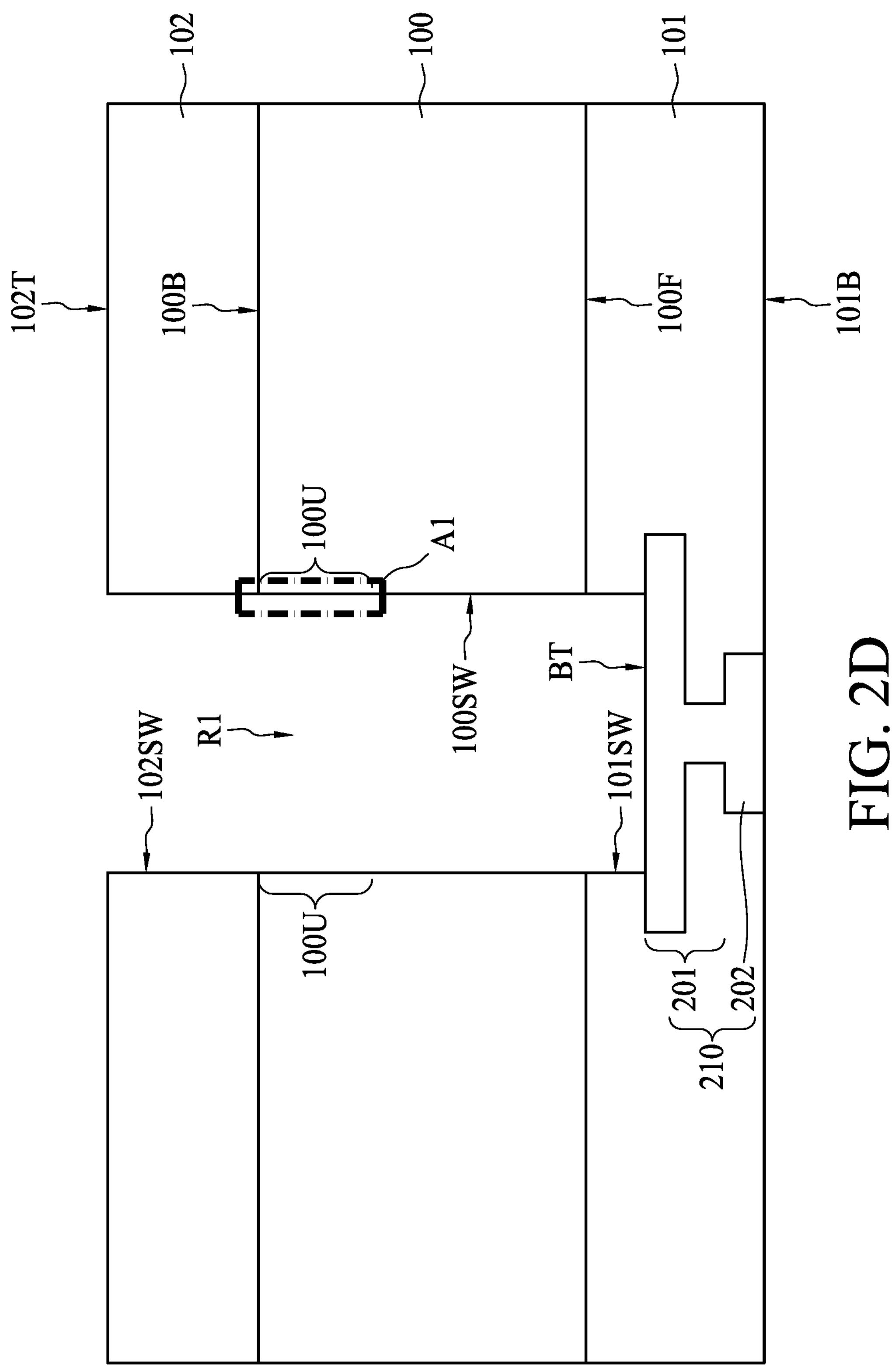
Figure 2D:
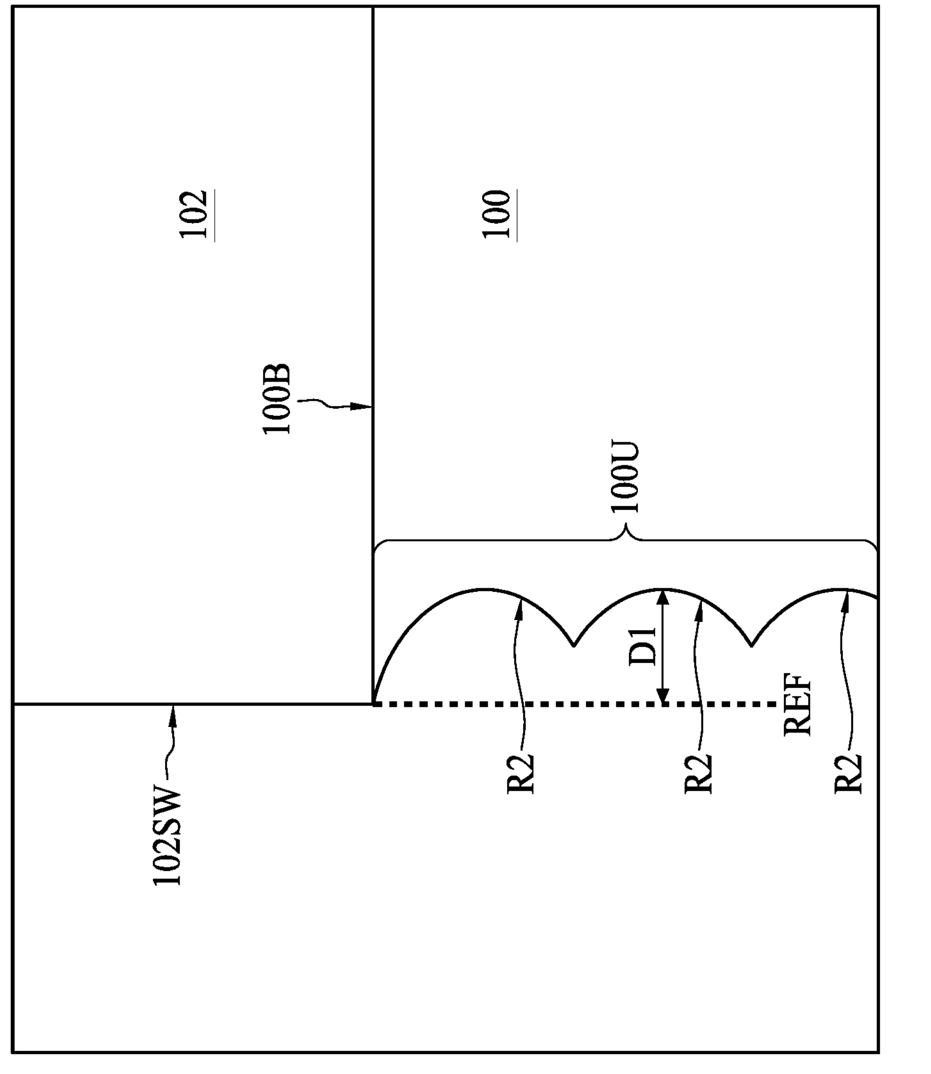

FIG. 2D is a cross-sectional diagram of an intermediate stage in the formation of a semiconductor device in accordance with some embodiments of the present disclosure, and FIG. 2D' is an enlarged schematic diagram of a dotted region A1 shown in FIG. 2D in accordance with some embodiments of the present disclosure. In the operation S14, a first recess R1 is formed by recessing the top surface 102T of the second passivation layer 102. The forming of the first recess R1 may include a lithographic operation and/or an etching operation. In some embodiments, the etching operation includes repeating cycles of: (1) depositing a thin film (not shown) by applying a $CF_x$ plasma, (2) removing a bottom portion of the aforesaid thin film with an anisotropic etching operation, and (3) performing a silicon etching operation with fluorine radicals in $SF_6$ plasma. The above-described etching operation is more suitable for forming deep trenches than some other types of etching operations. After the etching operation is performed, a sidewall 102SW of the second passivation layer 102, a sidewall 100SW of the first substrate 100, and a sidewall 101SW of the first passivation layer 101 are exposed in the first recess R1. A portion of the conductive feature 210 is under a projection area of the first recess R1. Further, a bottom BT of the first recess R1 may stop at the conductive feature 210. For example, a portion of the interconnect structure 201 is exposed at the bottom BT of the first recess R1.

Further, as shown in FIG. 2D', a recessed portion 100U may also be formed in the operation S14. Specifically, when the aforesaid etching operation is performed, a portion of the first substrate 100 proximal to the back side 100B of the first substrate 100 may be partially removed in a lateral direction. In the embodiments where the first substrate 100 includes silicon, the formation of the recessed portion 100U proximal to the back side 100B of the first substrate 100 can be referred to as "silicon undercut." The recessed portion 100U is at a peripheral area of the first recess R1 in the sidewall 100SW of the first substrate 100. Alternatively stated, a plurality of second recesses R2 are formed in the recessed portion 100U in the sidewall 100SW of the first substrate 100 in a location that is proximal to the second passivation layer 102. A depth D1 of one second recess R2 (i.e., a distance measured from a tip of the second recess R2 to an imaginary surface REF, wherein the imaginary surface REF is aligned with the sidewall 102SW of the second passivation layer 102) may be in a range from about 100 nm to about 500 nm. If the depth D1 is greater than the aforesaid range, the first substrate 100 may suffer from greater extent of material loss, which may further lead to reliability issues.

Figure 2E:
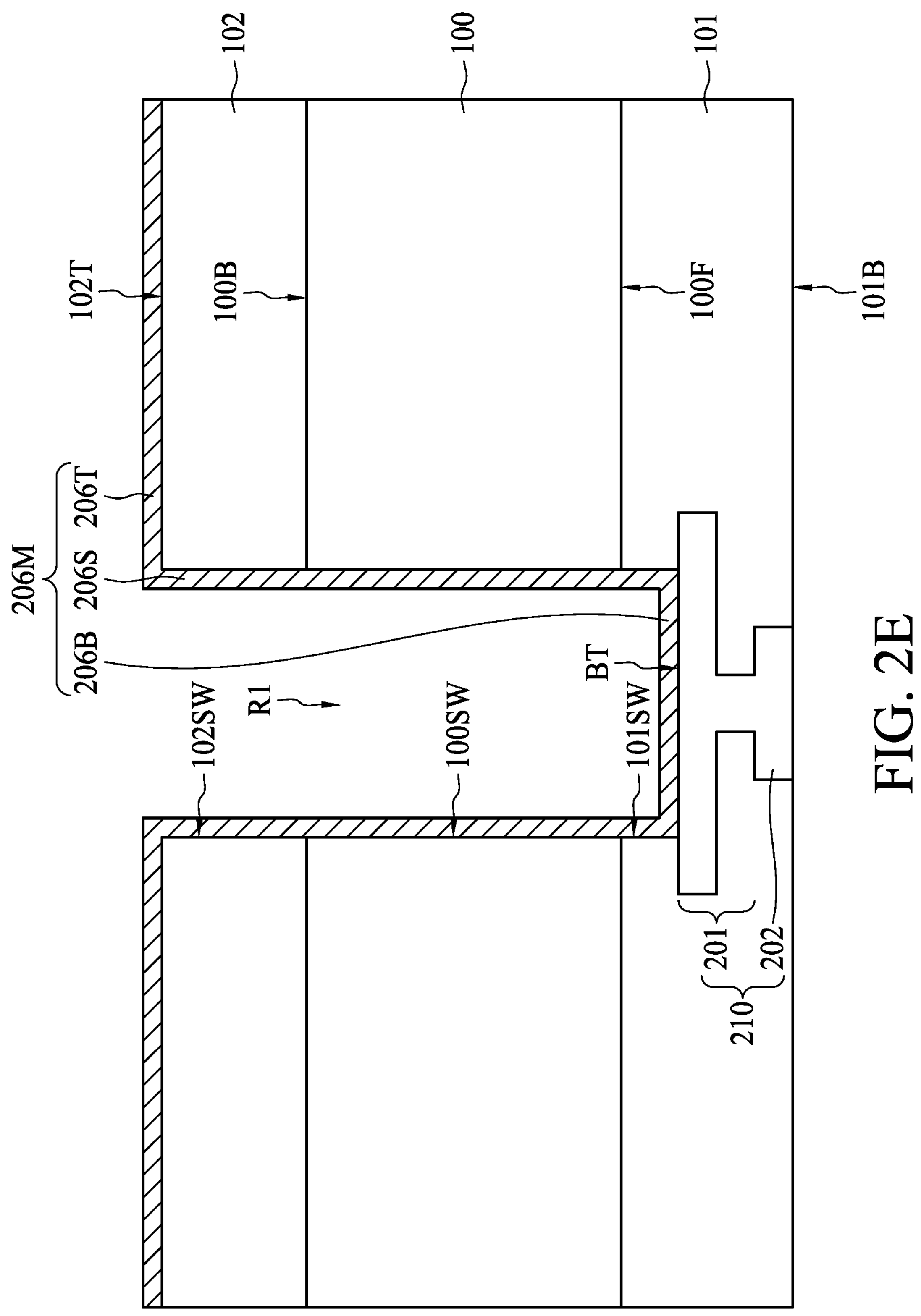
FIGS. 2E to 2F are cross-sectional diagrams of intermediate stages in the formation of a semiconductor device in accordance with some embodiments of the present disclosure.
Figure 2F:
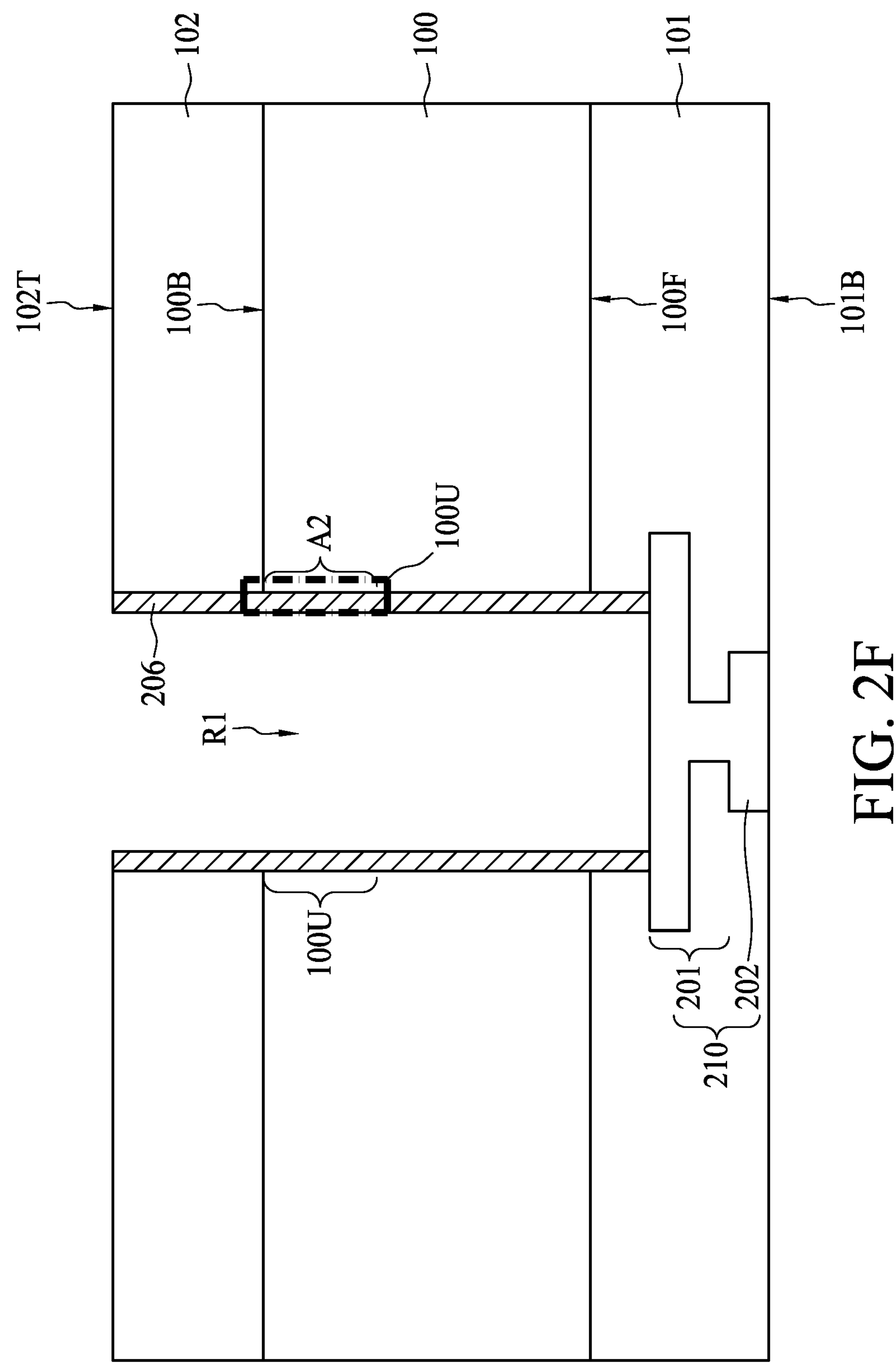
Figure 2F:
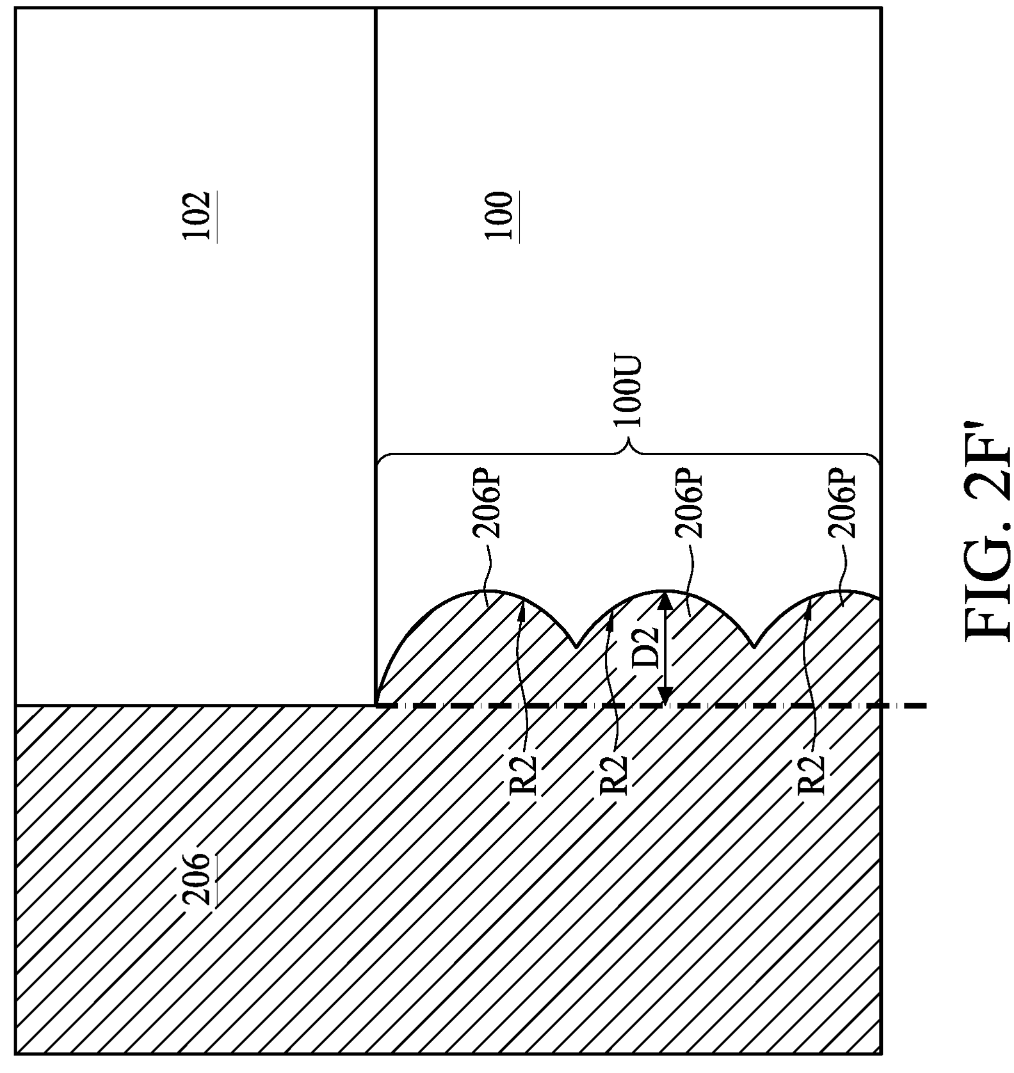

FIGS. 2E and 2F are cross-sectional diagrams of intermediate stages in the formation of a semiconductor device in accordance with some embodiments of the present disclosure. In the operation S15, an isolation liner 206 (shown in FIG. 2F) is formed in the first recess R1. The operation S15 includes a multi-step operation, including forming an isolation liner material layer 206M in the first recess R1 and over the top surface 102T of the second passivation layer 102 (shown in FIG. 2E) and partially removing the isolation liner material layer 206M to form the isolation liner 206 (shown in FIG. 2F). In some embodiments, a blanket deposition is performed to form the isolation liner material layer 206M both in the first recess R1 and over the top surface 102T of the second passivation layer 102. Alternatively stated, the isolation liner material layer 206M includes (1) a top portion 206T over the top surface 102T of the second passivation layer 102, (2) a sidewall portion 206S lining a sidewall of the first recess R1 (that is, lining the sidewall 100SW of the first substrate 100, the sidewall 101SW of the first passivation layer 101, and the sidewall 102SW of the second passivation layer 102), and (3) a bottom portion 206B at the bottom BT of the first recess R1 and over the interconnect structure 201.

In some embodiments, a material of the isolation liner material layer 206M includes oxide-based material, nitride-base material, or another suitable material, which can be selected from materials with lower dielectric constant.

Still referring to the operation S15, an etching operation is performed to remove the top portion 206T and the bottom portion 206B of the isolation liner material layer 206M, wherein the remaining portion of the sidewall portion 206S of the isolation liner material layer 206M constitutes the isolation liner 206. Alternatively stated, the isolation liner 206 is thereby formed over the sidewall 100SW of the first substrate 100, over the sidewall 101SW of the first passivation layer 101, and over the sidewall 102SW of the second passivation layer 102. In some embodiments, an upper portion of the sidewall portion 206S of the isolation liner material layer 206M may also be partially removed, but the present disclosure is not limited thereto.

FIG. 2F' is an enlarged schematic diagram of a dotted region A2 shown in FIG. 2F in accordance with some embodiments of the present disclosure. Following the discussion in reference to FIGS. 2E and 2F, the isolation liner 206 is further formed in the second recesses R2 in the recessed portion 100U. The isolation liner 206 includes a plurality of protrusions 206P in the second recesses R2, wherein the protrusions 206P protrude toward the first substrate 100. The protrusions 206P are in physical contact with the first substrate 100. A height D2 of one protrusion 206P may correspond to the depth D1 shown in FIG. 2D', which is in a range from about 100 nm to about 500 nm. The depth D2 may be greater than 100 nm so that the adhesion between the isolation liner 206 and the first substrate 100 can be enhanced, thereby improving the reliability of the semiconductor device as discussed subsequently.

In the operation S16, a polymer liner 205 is formed in the first recess R1. The forming of the polymer liner 205 will be subsequently discussed in reference to FIGS. 2G to 2H.

Figure 2G:
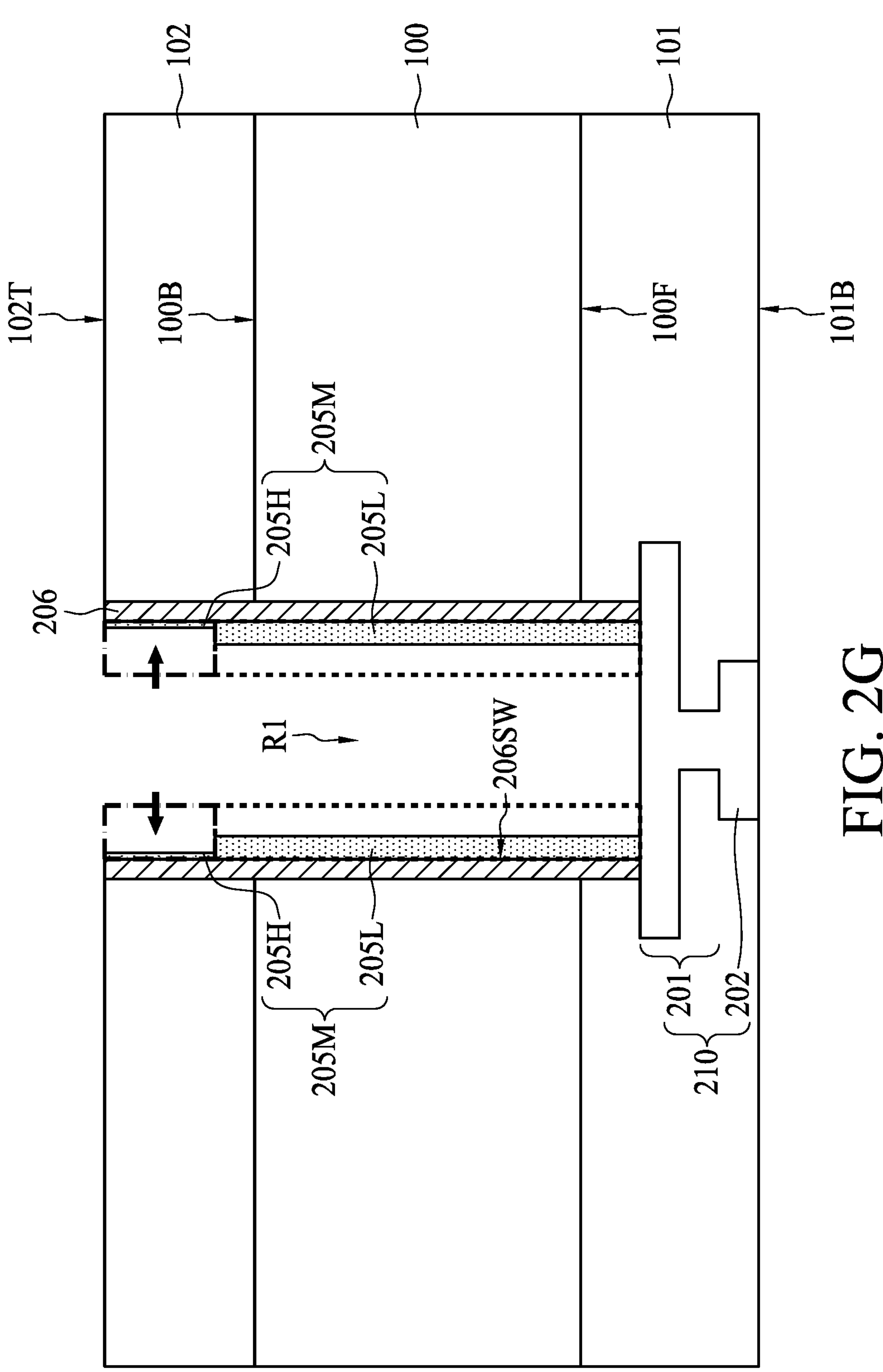
FIG. 2G is a cross-sectional diagram of an intermediate stage in the formation of a semiconductor device in accordance with some embodiments of the present disclosure.
Figure 2G:
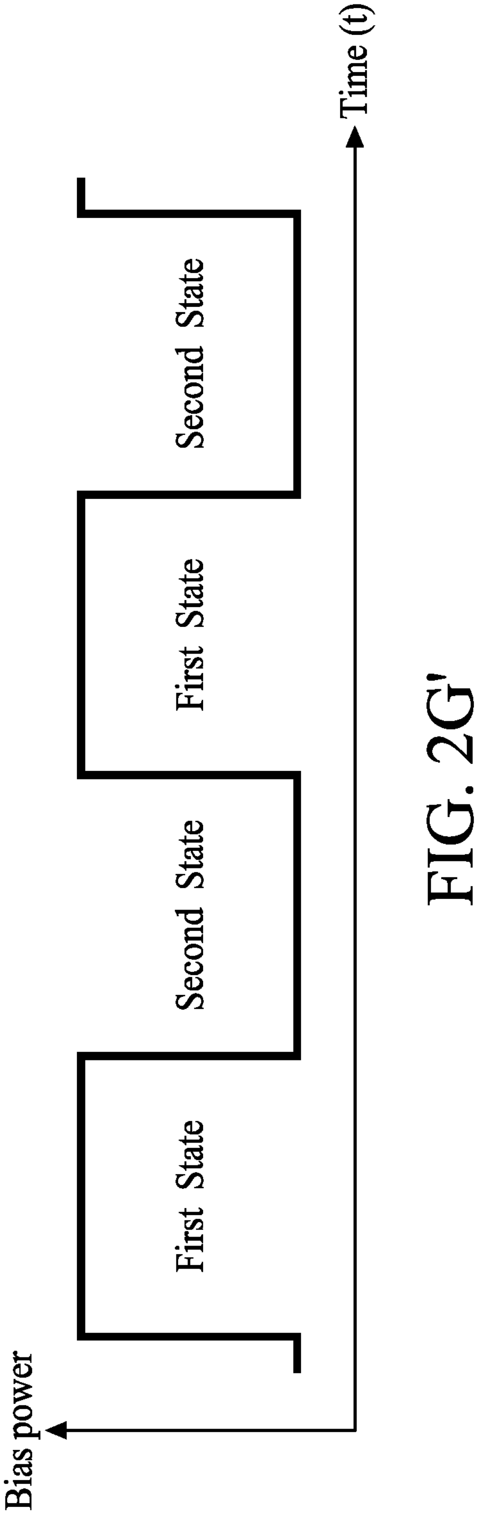

FIG. 2G is a cross-sectional diagram of an intermediate stage in the formation of a semiconductor device in accordance with some embodiments of the present disclosure. A polymer material layer 205M is formed in the first recess R1 and over a sidewall 206SW of the isolation liner 206. The forming of the polymer material layer 205M includes supplying a carbon-based chemical over the first recess R1. In some embodiments, the carbon-based chemical may be carbon-rich gas, such as $C_4F_8$ or $C_4F_6$. In some alternative embodiments, the carbon-based chemical may be carbon monoxide (CO). A material of the polymer material layer 205M may be fluorine-based polymer, which also includes carbon. A dielectric constant of the polymer material layer 205M may be less than 3.5. The polymer material layer 205M is formed over the isolation liner 206. In some embodiments, the polymer material layer 205M is formed by a pulsed etching operation, which includes a plurality of repeating cycles of (1) partially removing the polymer material in a first state, and (2) depositing of the polymer material in a second state. By properly controlling the removal rate in the first state and the deposition rate in the second state, the polymer material layer 205M can be shaped in a desired fashion. The pulsed etching operation may include repeatedly altering a bias power over time, as discussed in reference to FIG. 2G' or FIG. 2G", along with controlling various factors or conditions of the pulsed etching operation (such as temperature, etching time, etc.). Further, the polymer material layer 205M may be formed in different fashions at different positions. In some embodiments, a removal rate of the polymer material layer 205M proximal to an opening of the first recess R1 may be relatively higher than a removal rate at a lower position of the first recess R1.

FIG. 2G' shows a bias power-time diagram of a pulsed etching operation in accordance with some embodiments of the present disclosure. A first type of pulsed etching operation is depicted in FIG. 2G'. In the first type of pulsed etching operation, the step of (1) partially removing the polymer material in the first state is performed first, followed by the step of (2) depositing the polymer material in the second state. In the first state, higher bias power is applied, wherein the reactant is disassociated. In the second state, the bias power is decreased, thereby causing the reactant to be in an atomic state and able to be deposited in solid form over a surface. A switching interval of the bias power in the first type of pulsed etching operation may be in a range from about $10^{-4}$ s to about 10 s. That is, the first state and the second state are alternatively and repeatedly switched with a switching interval in the range from about $10^{-4}$ s to about 10 s.

FIG. 2G" shows a bias power-time diagram of a pulsed etching operation in accordance with different embodiments of the present disclosure. A second type of pulsed etching operation is depicted in FIG. 2G". The second type of pulsed etching operation is similar to the first type of pulsed etching operation discussed in reference to FIG. 2G', with a difference in that the step of (2) depositing the polymer material in the second state is instead performed prior to the step of (1) partially removing the polymer material in the first state. A switching interval of the bias power in the second type of pulsed etching operation may be in a range from about $10^{-4}$ s to about 10 s. That is, the first state and the second state are alternatively and repeatedly switched with a switching interval in the range from about $10^{-4}$ s to about 10 s.

Referring back to FIG. 2G, by performing the first type of pulsed etching operation as discussed in reference to FIG. 2G' or the second type of pulsed etching operation as discussed in reference to FIG. 2G", the shape of the polymer material layer 205M can be controlled. Accordingly, the initially deposited polymer material layer 205M includes a lower portion 205L and an upper portion 205H above the lower portion 205L, wherein the upper portion 205H is proximal to the top surface 102T of the second passivation layer 102. During the pulsed etching operation (either the first type or the second type of pulsed etching operation), a removal rate of the upper portion 205H is greater than a depositing rate of the upper portion 205H, while a depositing rate of the lower portion 205L is greater than a removal rate of the lower portion 205L. Further, a removal rate of polymer material at the bottom BT of the first recess R1 is greater than the deposition rate of the polymer material, thus the interconnect structure 201 may remain exposed to the first recess R1 after the pulsed etching operation. A result of the shaping of the polymer material layer 205M into a polymer liner 205 is illustrated in FIG. 2H.

Figure 2H:
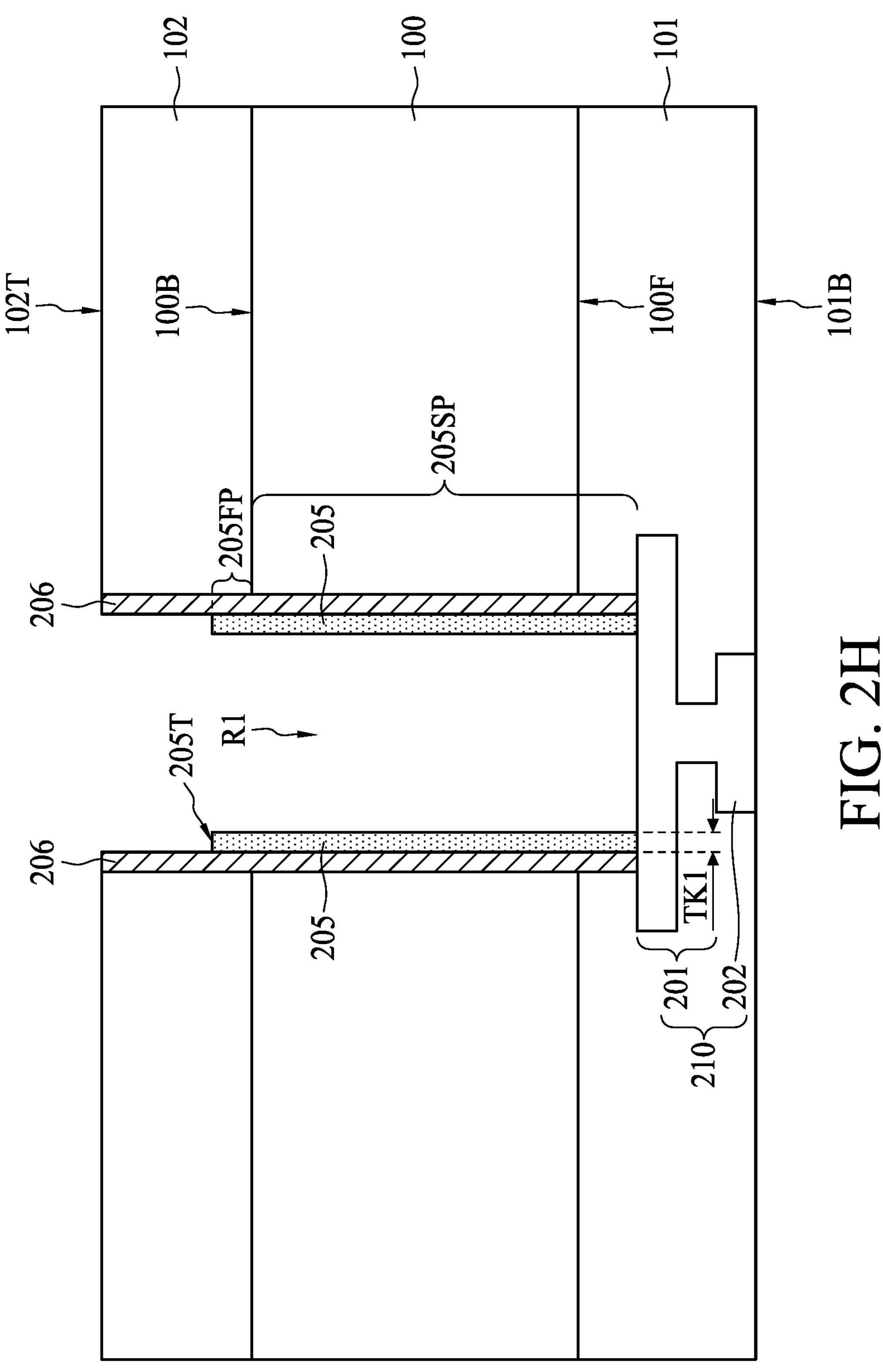
FIGS. 2H to 2L are cross-sectional diagrams of intermediate stages in the formation of a semiconductor device in accordance with some embodiments of the present disclosure.

FIG. 2H is a cross-sectional diagram of an intermediate stage in the formation of a semiconductor device in accordance with some embodiments of the present disclosure. The polymer liner 205 formed from the polymer material layer 205M is deposited in the first recess R1. As a result, the polymer liner 205 has a top surface 205T lower than the top surface 102T of the second passivation layer 102. A portion of the isolation liner 206 may be exposed above the polymer liner 205. In some embodiments, as shown in FIG. 2H, the top surface 205T of the polymer liner 205 is above the back side 100B of the first substrate 100. In some embodiments, the polymer liner 205 includes a first portion 205FP that is laterally surrounded by the second passivation layer 102, and a second portion 205SP that is laterally surrounded by the first substrate 100 and a portion of the first passivation layer 101. The first portion 205FP is above the second portion 205SP. The first portion 205FP is above the back side 100B of the first substrate 100. In some embodiments, the polymer liner 205 has a thickness TK1 that is in a range from about 50 nm to about 500 nm. The second portion 205SP of the polymer liner 205 is in direct contact with the interconnect structure 201 of the conductive feature 210. A material of the polymer liner 205 may include fluorine-based polymer, which also includes carbon. A dielectric constant of the polymer liner 205 may be less than 3.5.

Figure 2I:
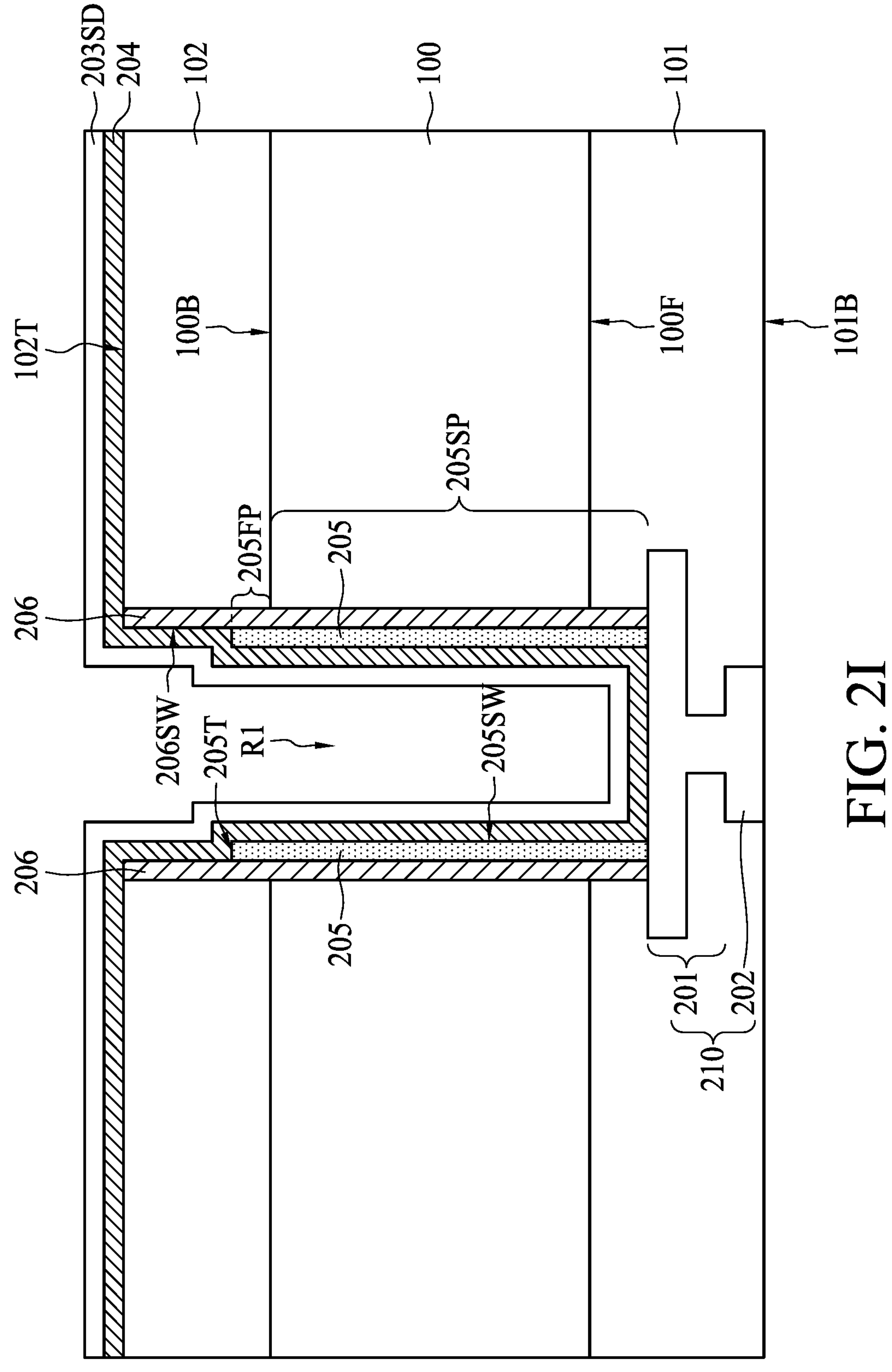

FIG. 2I is a cross-sectional diagram of an intermediate stage in the formation of a semiconductor device in accordance with some embodiments of the present disclosure. In the operation S17, a barrier layer 204 is formed in the first recess R1. In some embodiments, the barrier layer 204 is formed by blanket deposition. The barrier layer 204 is formed over the top surface 102T of the second passivation layer 102, over a sidewall 205SW of the polymer liner 205, over the top surface 205T of the polymer liner 205, over the sidewall 206SW of the isolation liner 206, and over the interconnect structure 201 that is exposed at the bottom BT of the first recess R1. In some embodiments, the barrier layer 204 may include cobalt, ruthenium, tantalum, tantalum nitride, indium oxide, tungsten nitride, titanium nitride, or other suitable materials.

After the operation S17 is performed, a seed layer 203SD can be formed over the barrier layer 204.

In the operation S18, a conductive material 203M is formed in the first recess R1 in order to form a through substrate via (TSV) 203, which will be discussed in reference to FIGS. 2J and 2K.

Figure 2J:
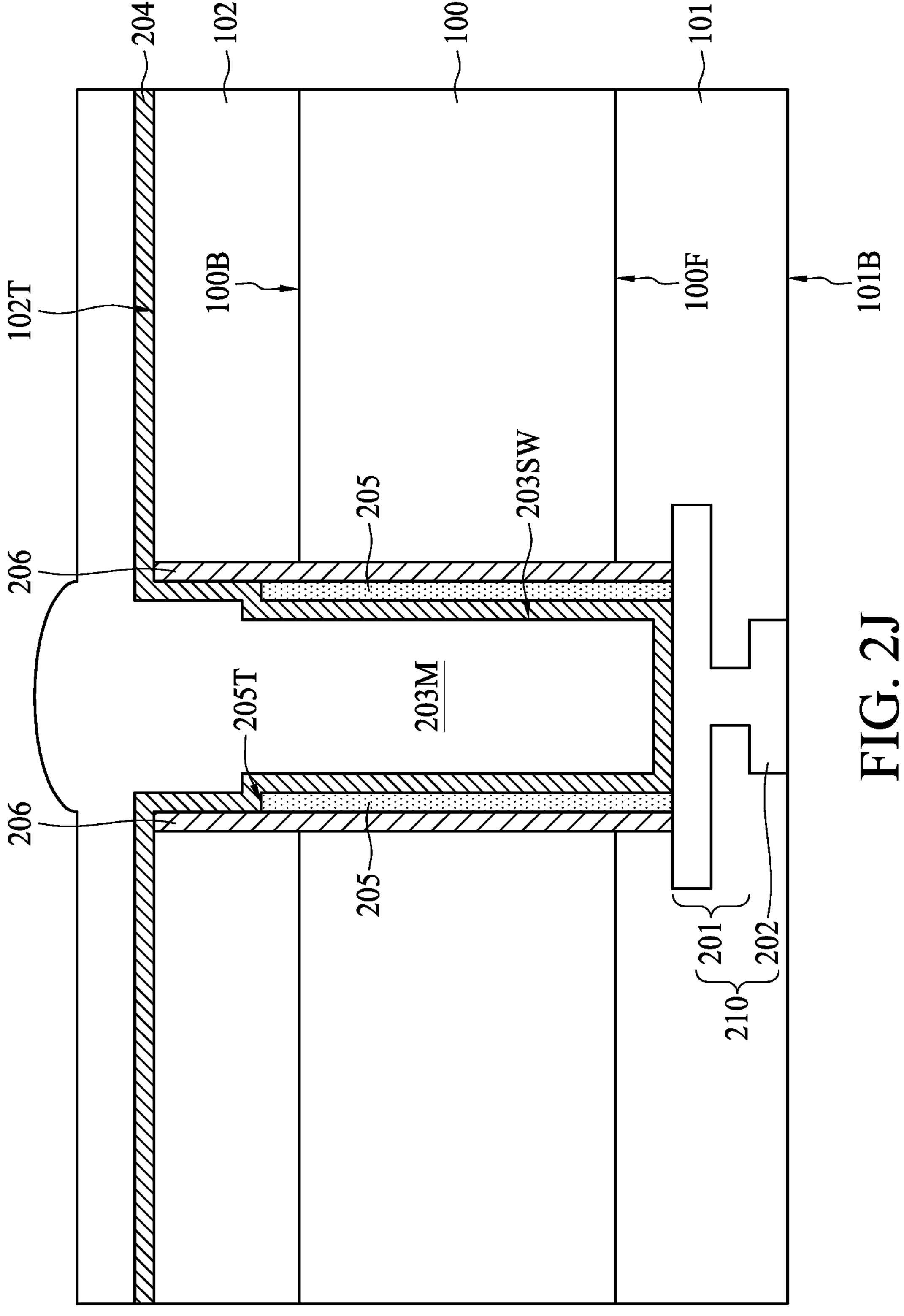

FIG. 2J is a cross-sectional diagram of an intermediate stage in the formation of a semiconductor structure in accordance with some embodiments of the present disclosure. In the operation S18, the conductive material 203M (such as copper or other types of metal, alloy, or the like) is formed in the first recess R1 and over the top surface 102T of the second passivation layer 102. In some embodiments, the conductive material 203M can be formed by plating, sputtering, or other types of deposition operations.

Figure 2K:
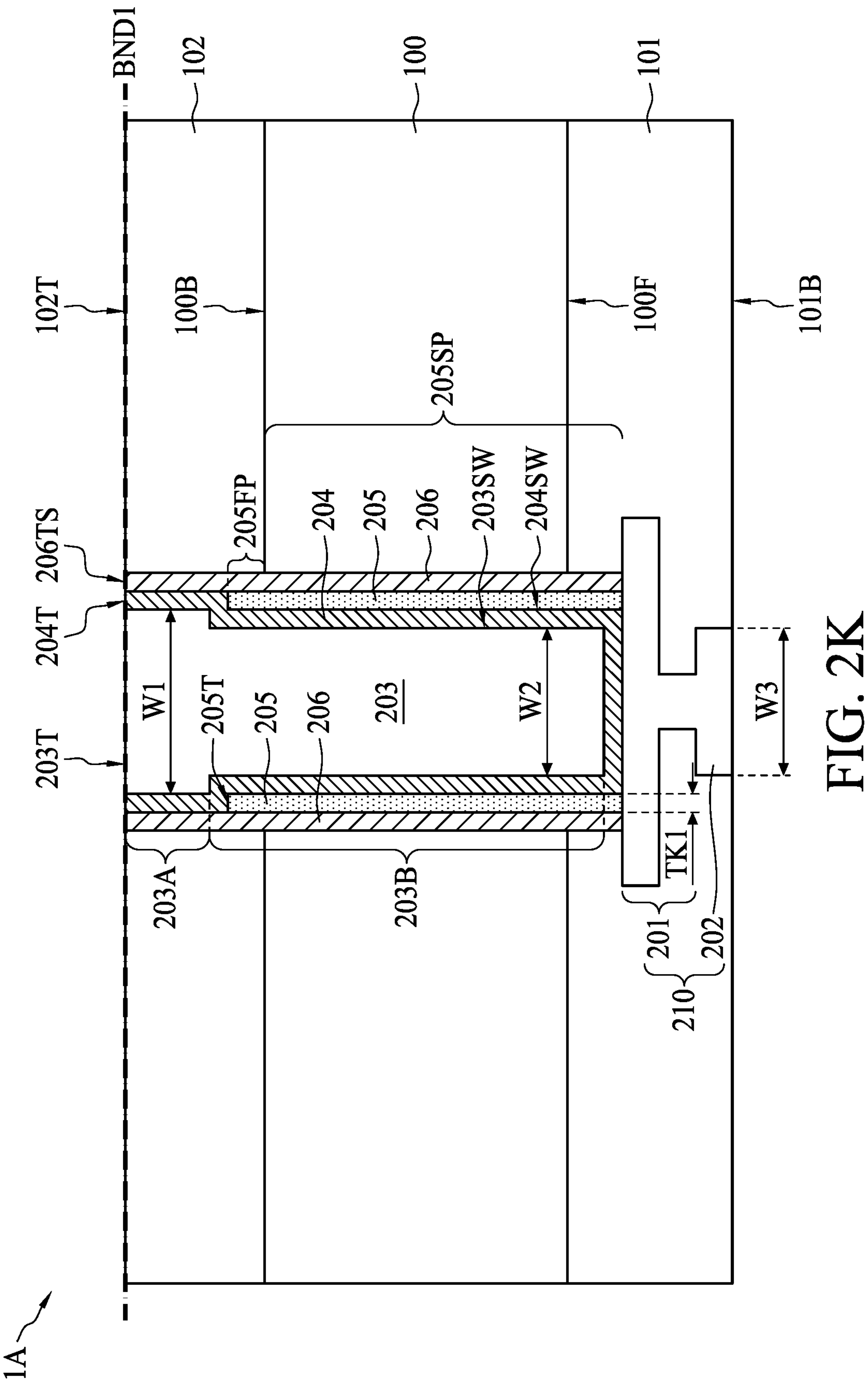

FIG. 2K is a cross-sectional diagram of an intermediate stage in the formation of a semiconductor device in accordance with some embodiments of the present disclosure. The operation S18 further includes a planarization operation, such as a chemical mechanical planarization (CMP) operation. By using the planarization operation, an excessive portion of the conductive material 203M can be removed in order to form the TSV 203, thereby forming a first semiconductor chip 1A. After the planarization operation is performed, a top surface 203T of the TSV 203 is coplanar with the top surface 102T of the second passivation layer 102, a top surface 204T of the barrier layer 204, and a top surface 206TS of the isolation liner 206. Accordingly, the top surface 203T of the TSV 203, the top surface 102T of the second passivation layer 102, the top surface 204T of the barrier layer 204, and the top surface 206TS of the isolation liner 206 are collectively referred to as a first bonding surface BND1. In some embodiments, the top surface 205T of the polymer liner 205 is separate from the first bonding surface BND1. Alternatively stated, the polymer liner 205 is free from being exposed through the first bonding surface BND1. Further, the barrier layer 204 conforms to a sidewall 203SW of the TSV 203. The barrier layer 204 extends between the polymer liner 205 and the TSV 203.

The TSV 203 is electrically coupled to the interconnect structure 201 of the conductive feature 210. The TSV 203 penetrates through the second passivation layer 102 and the first substrate 100. The TSV 203 may have a first portion 203A and a second portion 203B, wherein a width W1 of the first portion 203A is greater than a width W2 of the second portion 203B. The first portion 203A is above the second portion 203B, and the second portion 203B penetrates through the first substrate 100. In some embodiments, the width W1 of the first portion 203A is greater than a width W3 of the conductive pad 202.

The first semiconductor chip 1A can be utilized in various types of semiconductor devices, such as dynamic random-access memory (DRAM), three-dimensional integrated circuits (3DIC), memory stacks, logic stacks, memory devices, or the like. In some embodiments, in order to form the semiconductor device, the first semiconductor chip 1A can be stacked with other semiconductor chips or semiconductor structures. Some embodiments will be respectively discussed with reference to FIGS. 2L to 2M, FIG. 2N and FIG. 3.

In the operation S19, the first semiconductor chip 1A is coupled to a second semiconductor chip 1A'. In some embodiments, the first semiconductor chip 1A is bonded to the second semiconductor chip 1A' by performing a hybrid bonding operation. In some embodiments, a configuration of the second semiconductor chip 1A' can be similar to that of the first semiconductor chip 1A. The second semiconductor chip 1A' includes a second substrate 100A' that is similar to the first substrate 100A. The first substrate 100A of the first semiconductor chip 1A is coupled to the second substrate 100A' of the second semiconductor chip 1A' through the hybrid bonding operation. In the examples depicted in FIGS. 2L to 2M, FIG. 2N and FIG. 3, the second semiconductor chip 1A' is substantially identical to the first semiconductor chip 1A, and the second substrate 100A' is substantially identical to the first substrate 100A. However, it should be understood that a design of the second semiconductor chip 1A' and a design of the second substrate 100A' may also be changed.

Figure 2L:
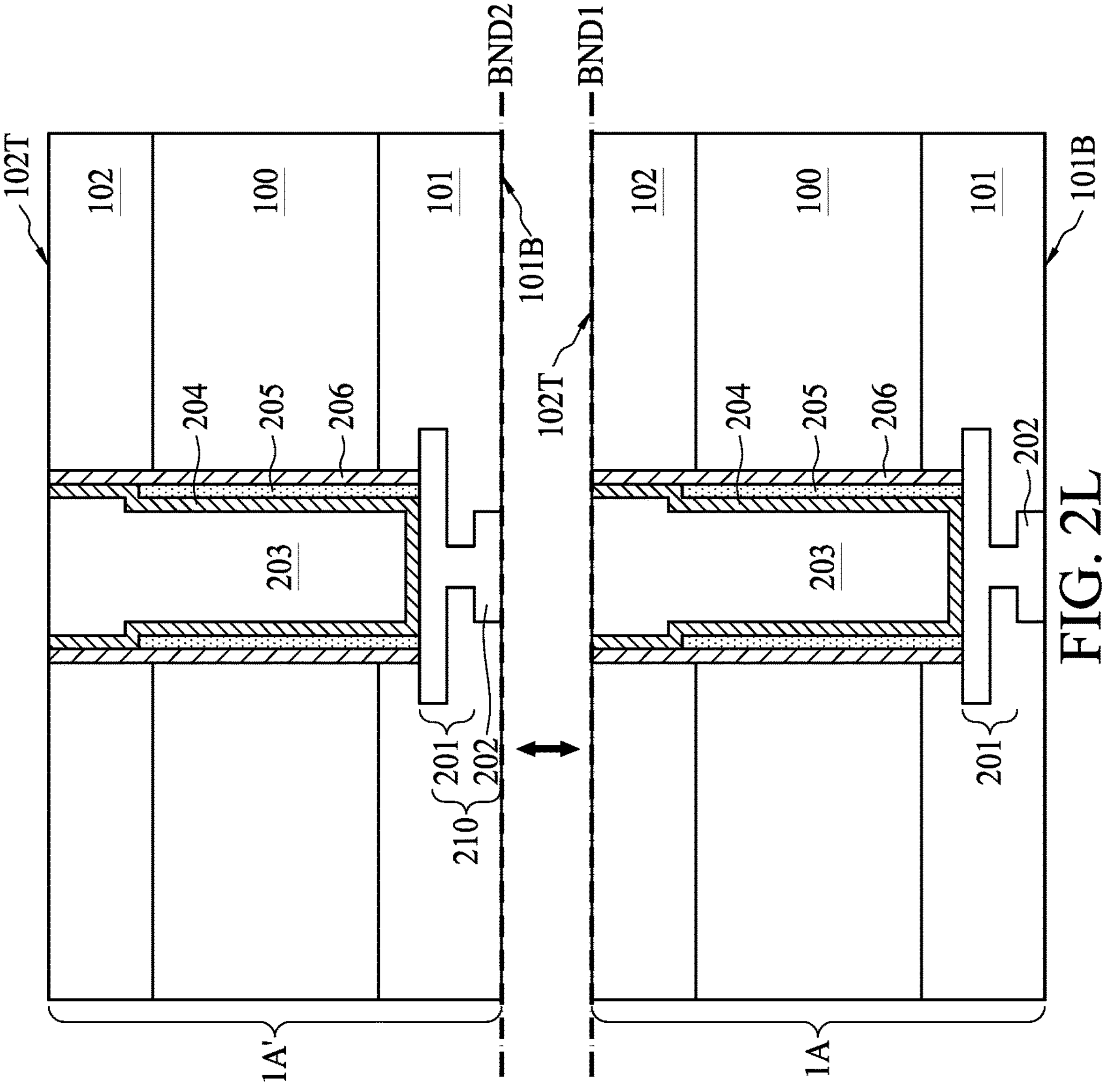
Figure 2M:
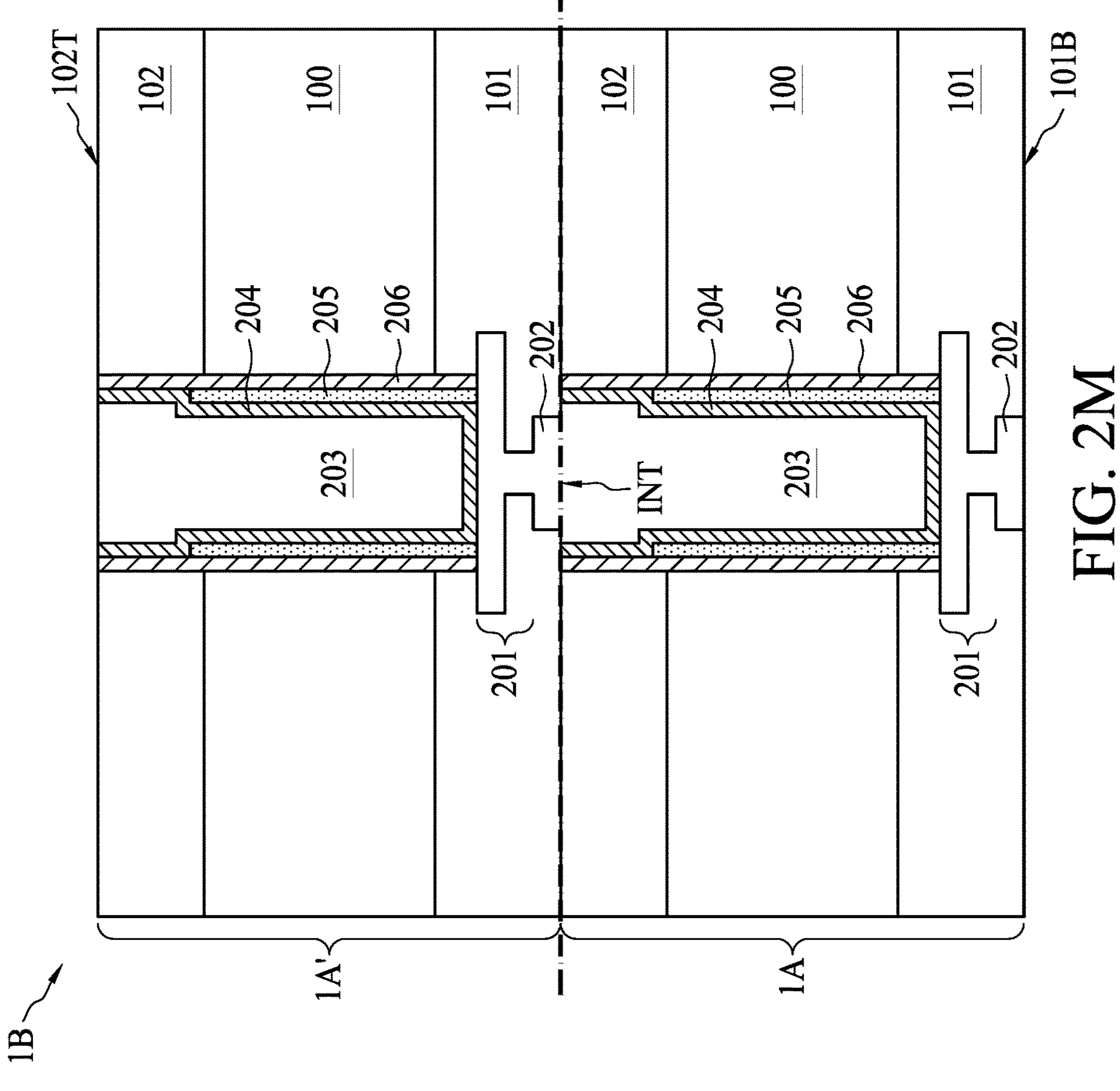
FIGS. 2M, 2N and 3 are cross-sectional views of semiconductor devices in accordance with some embodiments of the present disclosure.
Figure 2N:
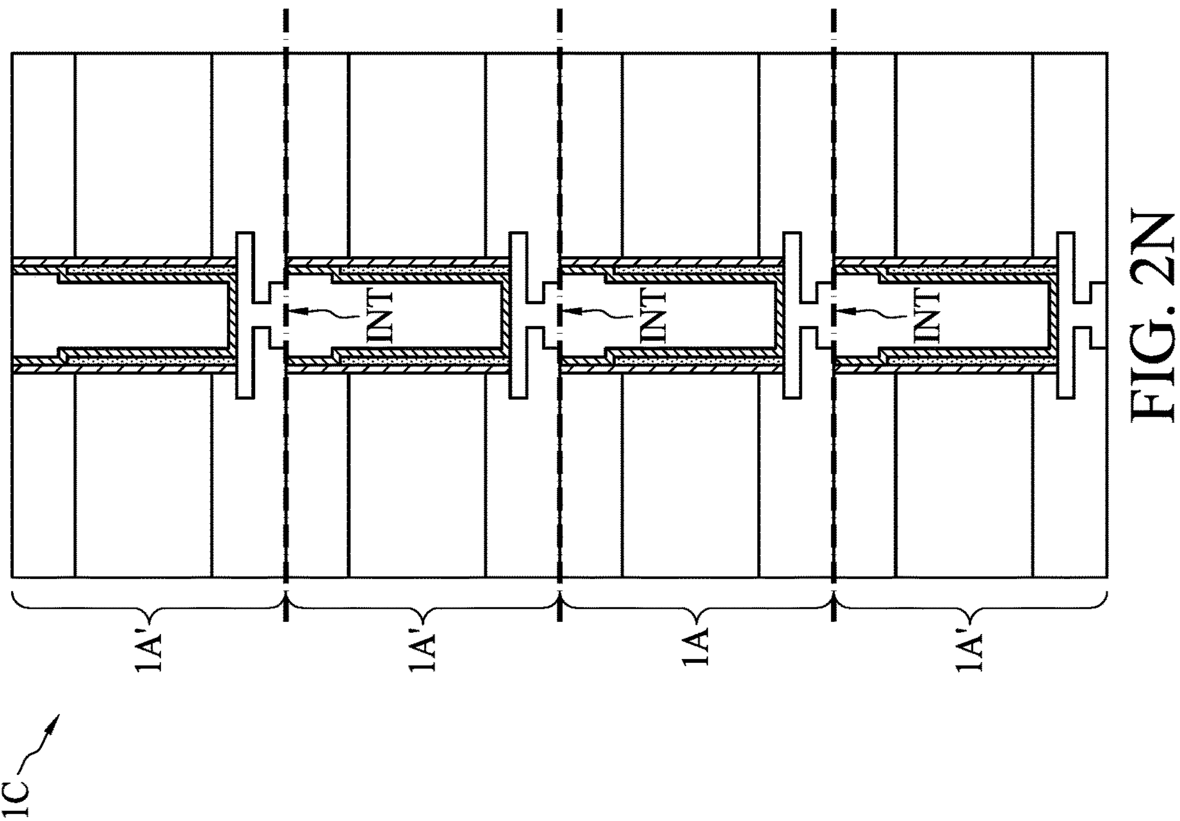

FIG. 2L is a cross-sectional diagram of an intermediate stage in the formation of a semiconductor device in accordance with some embodiments of the present disclosure. The operation S19 includes aligning the first semiconductor chip 1A with the second semiconductor chip 1A', wherein the first bonding surface BND1 of the first semiconductor chip 1A faces a second bonding surface BND2 of the second semiconductor chip 1A'. As in the first semiconductor chip 1A, in the second semiconductor chip 1A', a conductive pad 202 may be exposed through a back side 101B of the first passivation layer 101 of the second semiconductor chip 1A' and exposed through the second bonding surface BND2.

FIG. 2M is a cross-sectional view of a semiconductor device in accordance with some embodiments of the present disclosure. The operation S19 includes coupling the first semiconductor chip 1A to the second semiconductor chip 1A'. Firstly, the first bonding surface BND1 of the first semiconductor chip 1A is attached to the second bonding surface BND2 of the second semiconductor chip 1A' at a bonding interface INT at a first temperature (which can be around room temperature, such as about 25° C.). Secondly, the first semiconductor chip 1A and the second semiconductor chip 1A' are annealed at a second temperature that is greater than the first temperature, so that the first semiconductor chip 1A can be bonded to the second semiconductor chip 1A' by a hybrid bonding operation, thereby obtaining a semiconductor device 1B. In some embodiments, the second temperature is in a range from about 200° ° C. to 350° C. The TSV 203 of the first semiconductor chip 1A may be in direct contact with the first passivation layer 101 of the second semiconductor chip 1A'.

In some embodiments, the polymer liner 205 is separate from the bonding interface INT, so a reliability of the hybrid bonding operation in terms of adhesion between the first semiconductor chip 1A and the second semiconductor chip 1A' can be improved, and a negative impact on electrical properties of the semiconductor device 1B can be alleviated or limited.

Particularly, conventional bonding operations face issues caused by expansion of conductive materials at operation temperatures of hybrid bonding. Deformation of conductive materials may cause bonding surfaces to have a non-uniform profile, leading to poor adhesion between two chips.

In order to address the aforesaid issues, the present disclosure provides a semiconductor device with a polymer liner 205. Specifically, since the polymer liner 205 has great flexibility, it can reduce a deformation of the TSV 203 or buffer the negative effect caused by reduce deformation of the TSV 203. Accordingly, a degree of deformation of the TSV 203 (especially in a vertical direction) can be decreased, and a stress concentration in the TSV 203 can be alleviated. As a result, the yield of the hybrid bonding operation can be improved.

FIG. 2N is a cross-sectional view of a semiconductor device in accordance with some embodiments of the present disclosure. The semiconductor device 1C depicted in FIG. 2N is similar to the semiconductor device 1B depicted in FIG. 2M. A difference resides in that the semiconductor device 1C includes more than two semiconductor chips in a stack. For example, one first semiconductor chip 1A is coupled to more than one second semiconductor chip 1A' (please refer to the discussion in reference to FIGS. 2K to 2M). Alternatively stated, the hybrid bonding operation can be repeated. It should be understood that, when there are more semiconductor chips in a stack, the deformations of the TSVs 203 may compound, thus aggravating the tolerance issue regarding the hybrid bonding. Accordingly, the present disclosure provides resolutions to such issue for multi-chip stack configurations.

FIG. 3 is a cross-sectional view of a semiconductor device in accordance with some embodiments of the present disclosure. The semiconductor device 1D depicted in FIG. 3 is similar to the semiconductor device 1B depicted in FIG. 2M. The difference resides in that each of the first semiconductor chip 1A and the second semiconductor chip 1A' can have two or more TSVs 203.

In pursuit of greater device density, a distance between two adjacent TSVs 203 becomes smaller and smaller. Accordingly, inclusion of the polymer liner 205 can help alleviate electrical interference, thereby improving device performance.

Figure 4:
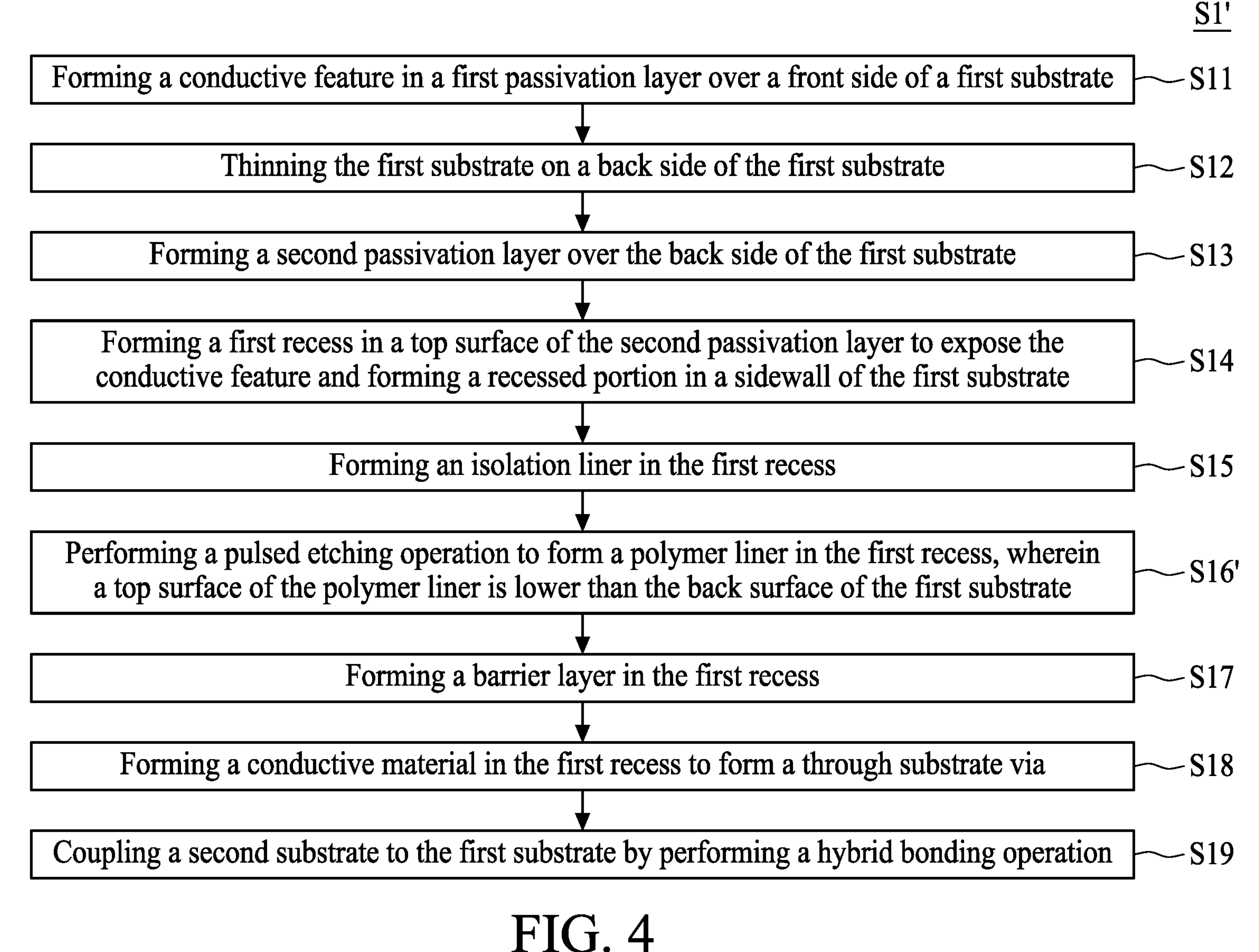
FIG. 4 is a flow diagram illustrating a method of manufacturing a semiconductor device in accordance with some embodiments of the present disclosure.

FIG. 4 is a flow diagram illustrating a method of manufacturing a semiconductor device in accordance with some embodiments of the present disclosure. The method S1' includes a number of operations (S11, S12, S13, S14, S15, S16', S17, S18, and S19) and the description and illustration are not deemed as a limitation to the sequence of the operations. In the operation S11, a conductive feature is formed in a first passivation layer over a front side of a first substrate. In the operation S12, the first substrate is thinned from a back side of the first substrate. In the operation S13, a second passivation layer is formed over the back side of the first substrate. In the operation S14, a first recess is formed in a top surface of the second passivation layer to expose the conductive feature, and a recessed portion is formed in a sidewall of the first substrate. In the operation S15, an isolation liner is formed in the first recess. In the operation S16', a pulsed etching operation is performed to form a polymer liner in the first recess, wherein a top surface of the polymer liner is lower than the back surface of the first substrate. In the operation S17, a barrier layer is formed in the first recess. In the operation S18, a conductive material is formed in the first recess in order to form a through substrate via (TSV). In the operation S19, a second substrate is coupled to the first substrate by performing a hybrid bonding operation.

Figure 5A:
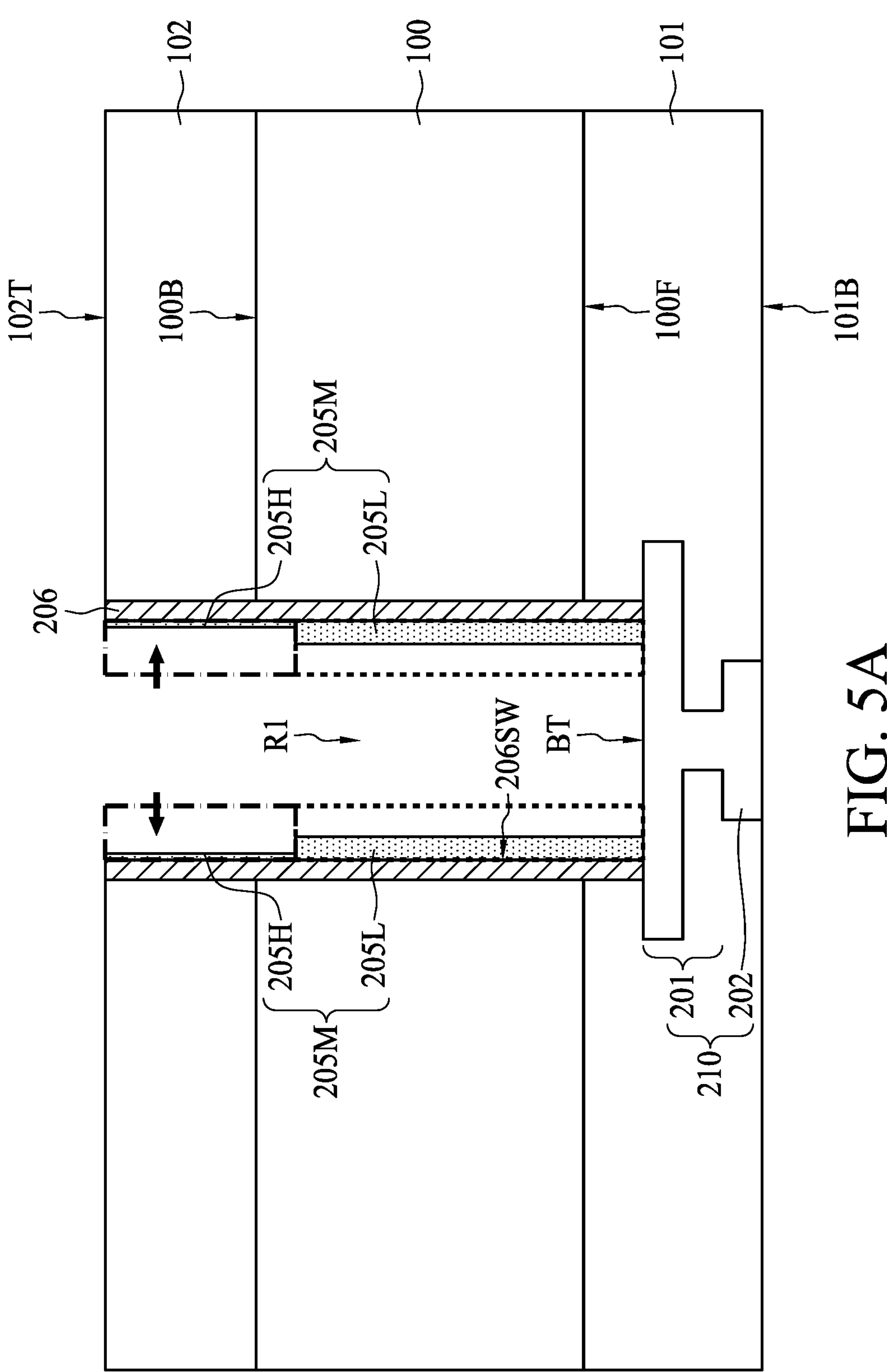
FIGS. 5A to 5C are cross-sectional diagrams of intermediate stages in the formation of a semiconductor device in accordance with some embodiments of the present disclosure.
Figure 5B:
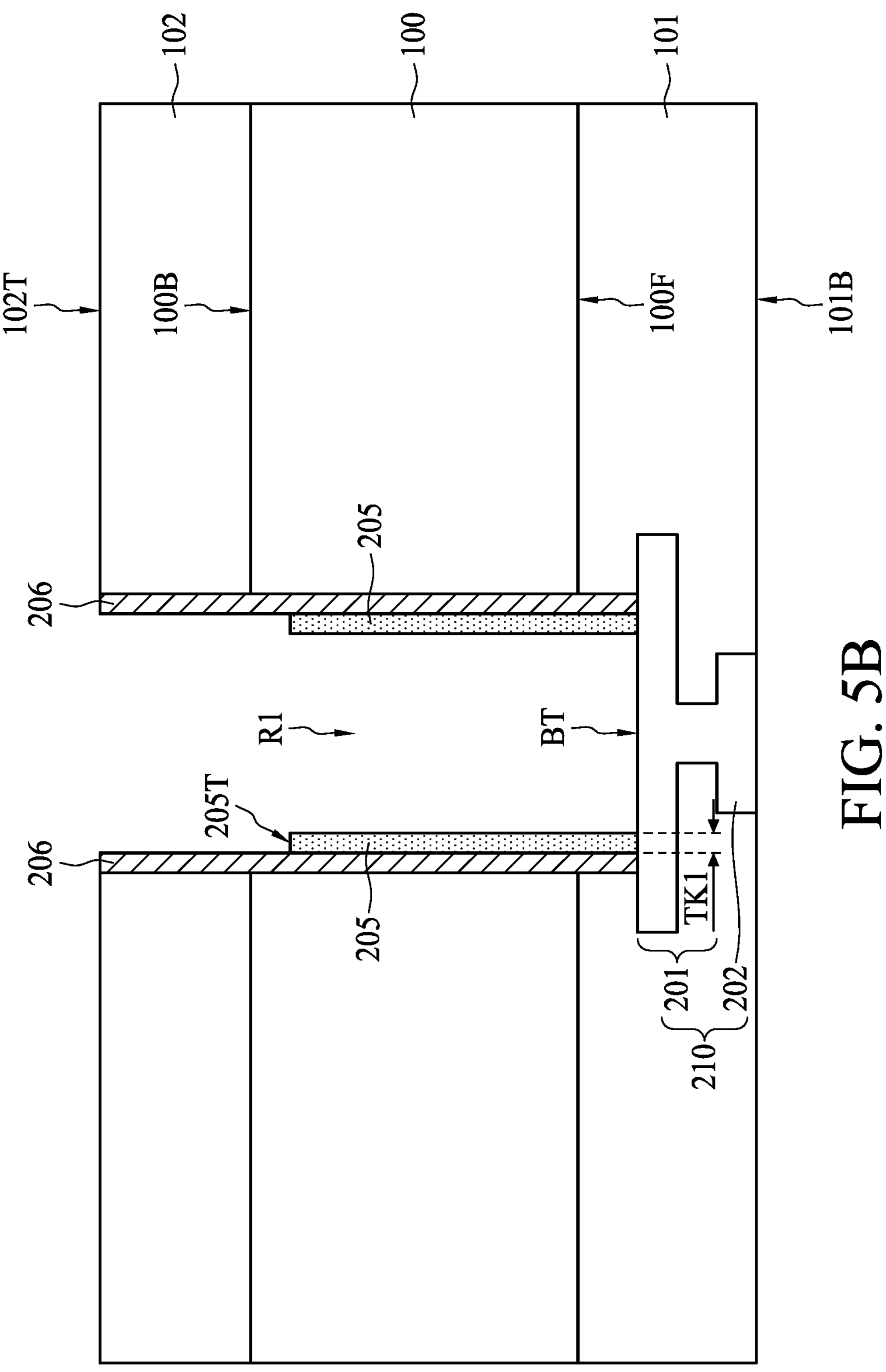
Figure 5C:
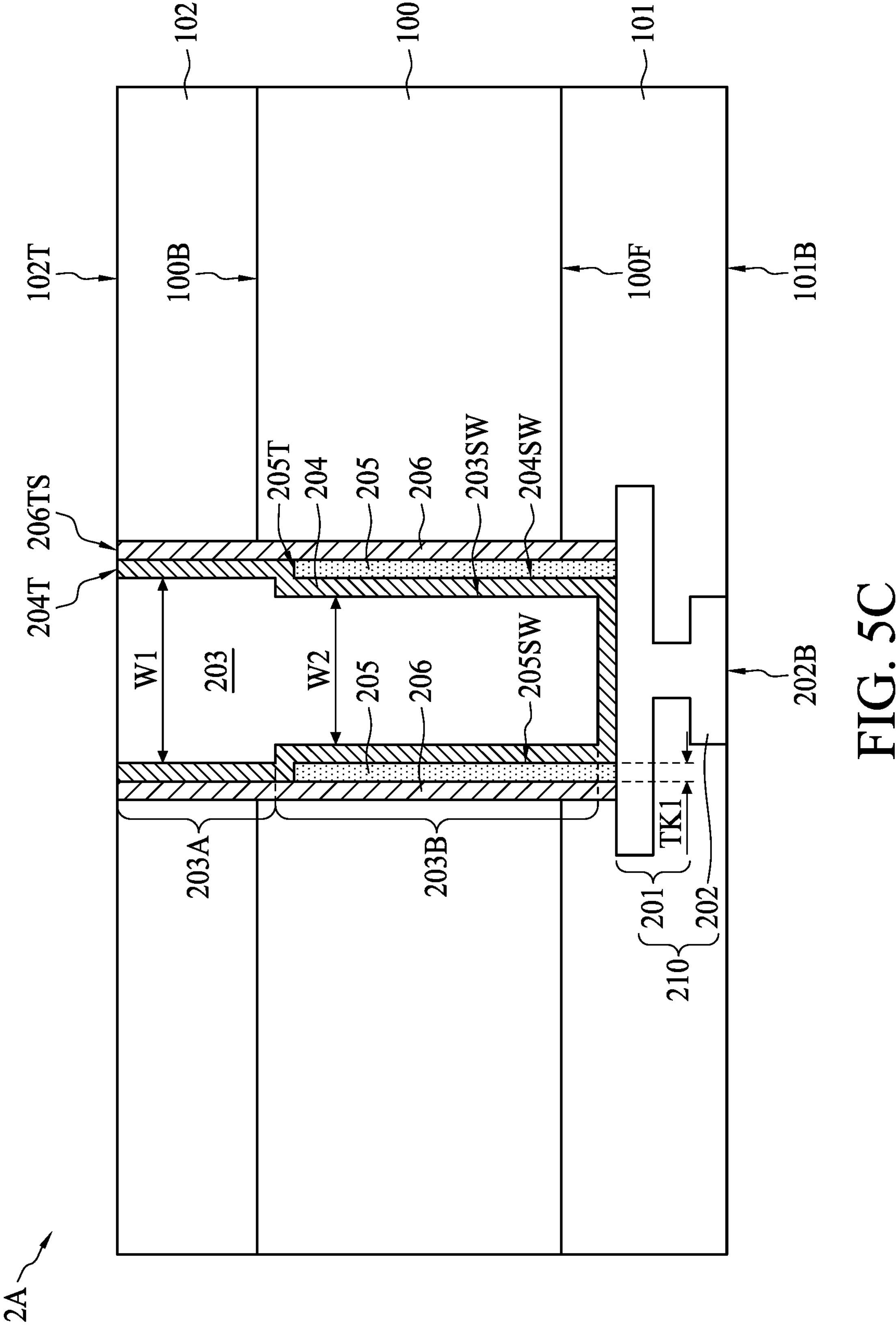
Figure 5D:
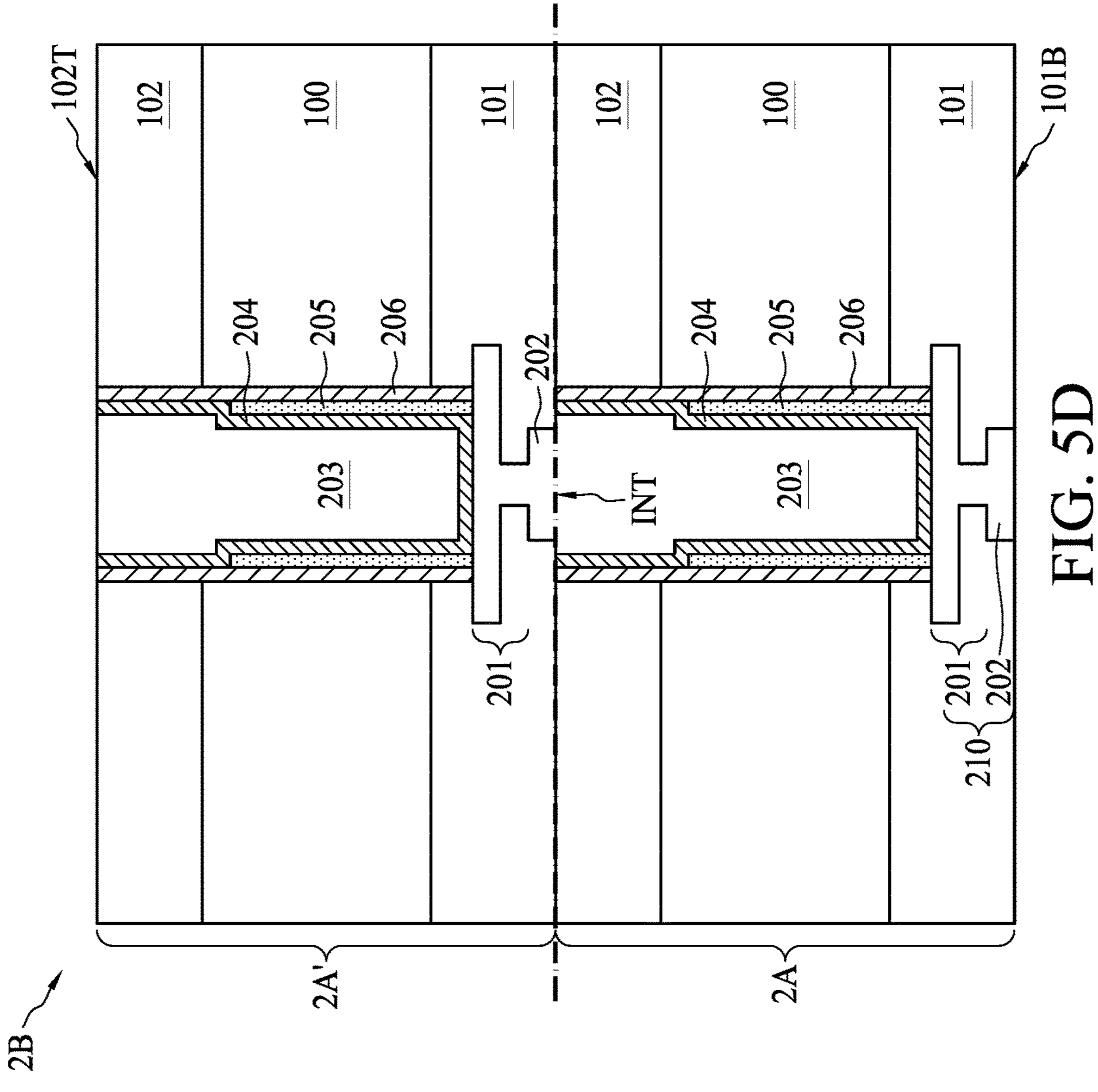
FIG. 5D is a cross-sectional view of a semiconductor device in accordance with some embodiments of the present disclosure.
Figure 5E:
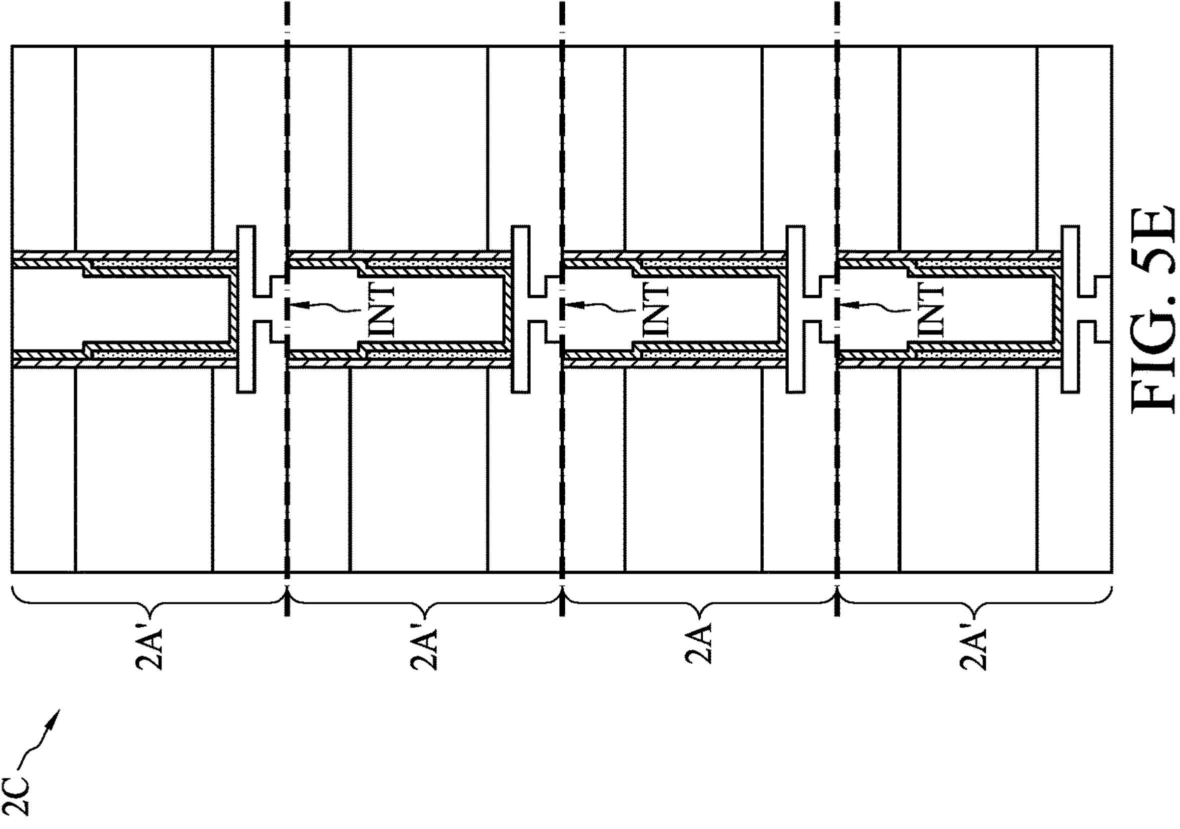
FIG. 5E is a cross-sectional view of a semiconductor device in accordance with some embodiments of the present disclosure.
Figure 6:
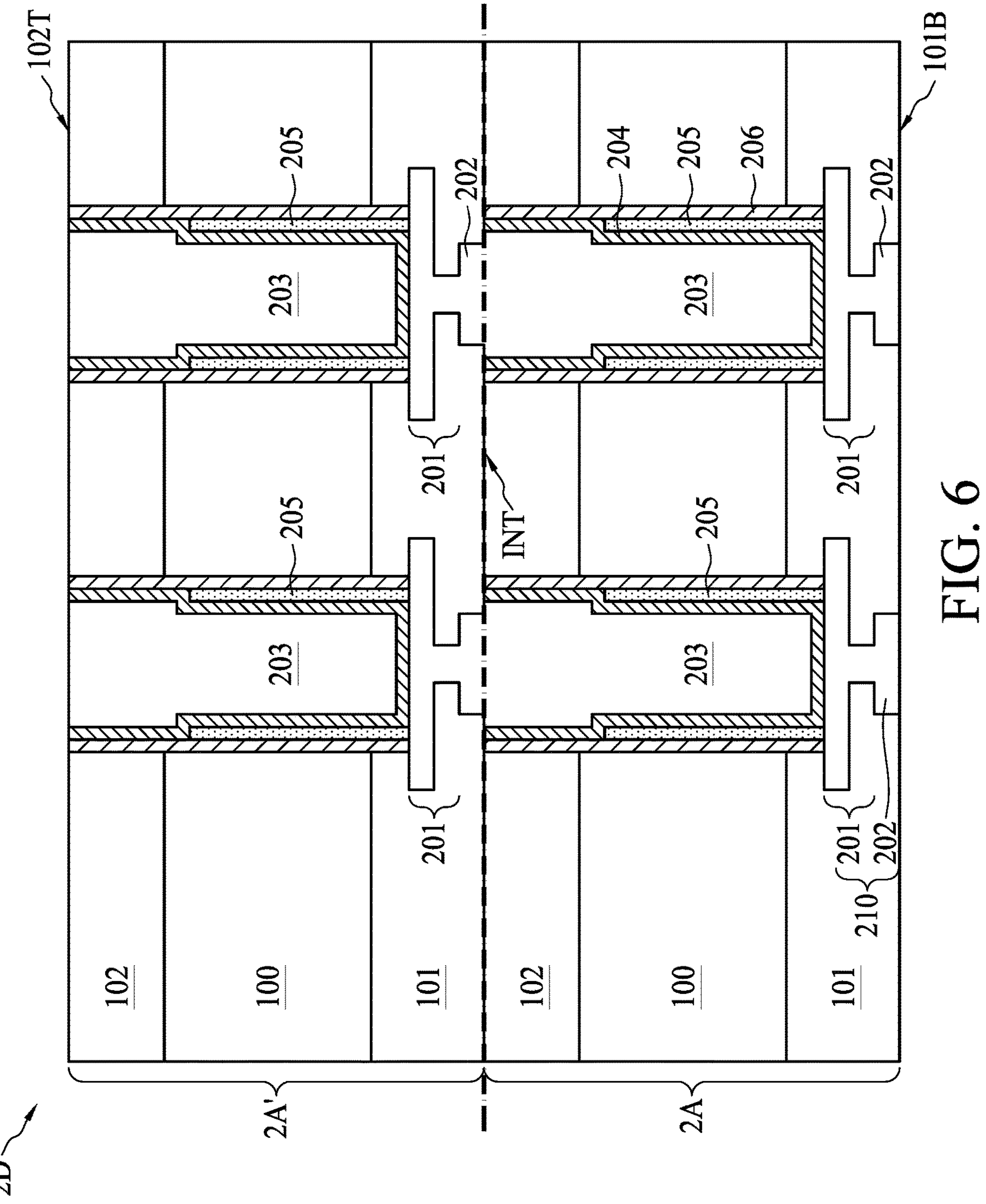
FIG. 6 is a cross-sectional view of a semiconductor device in accordance with some embodiments of the present disclosure.

FIGS. 5A to 5D are schematic diagrams illustrating various fabrication stages constructed according to the method S1' in accordance with some embodiments of the present disclosure. FIG. 5D, FIG. 5E, and FIG. 6 are schematic diagrams illustrating various devices that may be fabricated by performing operations in the method S1'. Further, the method S1' is similar to the method S1 depicted in FIG. 1, but with a difference in that the operation S16' in the method S1' is different from the operation S16 in the method S1, as will be discussed below. Alternatively stated, in the method S1', after performing the operations S11, S12, S13, S14, and S15 (which correspond to the operations illustrated in FIGS. 2A to 2F'), the operation S16' is performed instead of the operation S16. The operations S16', S17, S18, and S19, which are performed after the operation S15, will be discussed in reference to FIGS. 5A to 5D.

FIG. 5A is a cross-sectional diagram of an intermediate stage in formation of a semiconductor device in accordance with some embodiments of the present disclosure. A polymer material layer 205M is formed in a first recess R1 and over a sidewall 206SW of an isolation liner 206. The forming of the polymer material layer 205M includes performing the pulsed etching operation as discussed in reference to FIG. 2G, as well as in reference to FIG. 2G' or FIG. 2G". A material of the polymer material layer 205M may include fluorine-based polymer, which also includes carbon. A dielectric constant of the polymer material layer 205M may be less than 3.5. The polymer material layer 205M is formed over the isolation liner 206.

A shape of the polymer material layer 205M can be controlled. Accordingly, the polymer material layer 205M when initially deposited includes a lower portion 205L, and an upper portion 205H above the lower portion 205L, wherein the upper portion 205H is proximal to a top surface 102T of a second passivation layer 102. During the pulsed etching operation (either the first type or the second type of pulsed etching operation), a removal rate of the upper portion 205H is greater than a depositing rate of the upper portion 205H; while a depositing rate of the lower portion 205L is greater than a removal rate of the lower portion 205L. Further, a removal rate of polymer material at a bottom BT of the first recess R1 is greater than a deposition rate of polymer material, thus an interconnect structure 201 may remain exposed to the first recess R1 after the pulsed etching operation is performed.

Compared to the embodiment discussed in reference to FIG. 2G, the upper portion 205H in the embodiment discussed in reference to FIG. 5A instead extends to a position below a back side 100B of a first substrate 100. A result of forming the polymer material layer 205M into a polymer liner 205 is illustrated in FIG. 5B.

FIG. 5B is a cross-sectional diagram of an intermediate stage in the formation of a semiconductor device in accordance with some embodiments of the present disclosure. The polymer liner 205 formed from the polymer material layer 205M is deposited in the first recess R1. As a result, the polymer liner 205 has a top surface 205T lower than the top surface 102T of the second passivation layer 102. A portion of the isolation liner 206 may be exposed above the polymer liner 205. In some embodiments, as shown in FIG. 5B, the top surface 205T of the polymer liner 205 is below the back side 100B of the first substrate 100. In some embodiments, the polymer liner 205 has a thickness TK1 that is in a range from about 50 nm to about 500 nm. The polymer liner 205 is in direct contact with an interconnect structure 201 of a conductive feature 210. A material of the polymer liner 205 may include fluorine-based polymer. A dielectric constant of the polymer liner 205 may be less than 3.5.

FIG. 5C is a cross-sectional diagram of an intermediate stage in the formation of a semiconductor device in accordance with some embodiments of the present disclosure. Similar to the operations depicted in FIGS. 2I to 2K, the operations S17 and S18 are performed. In the operation S17, a barrier layer 204 is formed in the first recess R1. In some embodiments, the barrier layer 204 is formed over a sidewall 205SW of the polymer liner 205, over the top surface 205T of the polymer liner 205, over the sidewall 206SW of the isolation liner 206, and over the interconnect structure 201 that is exposed at the bottom BT of the first recess R1. After the operation S17 is performed, a seed layer 203SD can be formed over the barrier layer 204. In the operation S18, a TSV 203 is formed by depositing a conductive material in the first recess R1, then performing a planarization operation, such as a chemical mechanical planarization (CMP) operation. Accordingly, a first semiconductor chip 2A is formed.

Alternatively stated, the first semiconductor chip 2A depicted in FIG. 5C is similar to the first semiconductor chip 1A depicted in FIG. 2K, with a difference in that the top surface 205T of the polymer liner 205 is below the back side 100B of the first substrate 100. The first semiconductor chip 2A can be utilized in various types of semiconductor devices, such as dynamic random-access memory (DRAM), three-dimensional integrated circuit (3DIC), memory stacks, logic stacks, memory devices, or the like. In some embodiments, in order to form the aforesaid semiconductor device, the first semiconductor chip 2A can be stacked with other semiconductor chips or semiconductor structures. Some embodiments will be respectively discussed with reference to FIG. 5D, FIG. 5E and FIG. 6.

FIG. 5D is a cross-sectional view of a semiconductor device in accordance with some embodiments of the present disclosure. In the operation S19, the first semiconductor chip 2A is coupled to a second semiconductor chip 2A'. In some embodiments, the first semiconductor chip 2A is bonded to the second semiconductor chip 2A' by performing a hybrid bonding operation, thereby obtaining a semiconductor device 2B. In some embodiments, a configuration of the second semiconductor chip 2A' can be similar to that of the first semiconductor chip 2A depicted in FIG. 5C or the first semiconductor chip 1A depicted in FIG. 2K. The second semiconductor chip 2A' includes a second substrate 100A' that is similar to the first substrate 100A depicted in FIG. 2K. The first substrate 100A of the first semiconductor chip 2A is coupled to the second substrate 100A' of the second semiconductor chip 2A' through a hybrid bonding operation. The details of the hybrid bonding operation are discussed above with reference to FIGS. 2L to 2M.

FIG. 5E is a cross-sectional view of a semiconductor device in accordance with some embodiments of the present disclosure. The semiconductor device 2C depicted in FIG. 5E is similar to the semiconductor device 2B depicted in FIG. 5D. A difference is that the semiconductor device 2C depicted in FIG. 5E includes more than two semiconductor chips in a stack. For example, one first semiconductor chip 2A is coupled to more than one second semiconductor chips 2A'. Alternatively stated, the hybrid bonding operation can be repeated.

FIG. 6 is a cross-sectional view of a semiconductor device in accordance with some embodiments of the present disclosure. The semiconductor device 2D depicted in FIG. 6 is similar to the semiconductor device 2B depicted in FIG. 5D. A difference is that each of the first semiconductor chip 2A and the second semiconductor chip 2A' can have two or more TSVs 203.

One aspect of the present disclosure provides a semiconductor device including a first substrate, the first substrate having a front side and a back side opposite to the front side; a first passivation layer over the front side of the first substrate; a second passivation layer over the back side of the first substrate, wherein the second passivation layer has a top surface facing away from the first substrate; a conductive feature disposed in the first passivation layer, wherein the conductive feature includes a conductive pad and an interconnect structure electrically connected to the conductive pad; a through substrate via (TSV) penetrating through the second passivation layer and the first substrate, wherein the TSV is electrically coupled to the conductive feature; and a polymer liner between a sidewall of the TSV and the first substrate, wherein a top surface of the polymer liner is lower than the top surface of the second passivation layer.

Another aspect of the present disclosure provides a semiconductor device including a first semiconductor chip, the first semiconductor chip including a first substrate having a front side and a back side opposite to the front side; a first passivation layer over the front side of the first substrate; a second passivation layer over the back side of the first substrate, wherein the second passivation layer has a top surface facing away from the first substrate; a conductive feature disposed in the first passivation layer, wherein the conductive feature includes a conductive pad and an interconnect structure electrically connected to the conductive pad; a through substrate via (TSV) exposed through the second passivation layer, wherein the TSV is electrically coupled to the conductive feature; a polymer liner between a sidewall of the TSV and the first substrate; and a second semiconductor chip coupled to the first semiconductor chip at a bonding interface, the second semiconductor chip including a second substrate coupled to the first substrate, wherein the polymer liner of the first semiconductor chip is separate from the bonding interface.

Another aspect of the present disclosure provides a method for fabricating a semiconductor device including forming a conductive feature in a first passivation layer over a front side of a first substrate; forming a second passivation layer over a back side of the first substrate; forming a first recess in a top surface of the second passivation layer to expose the conductive feature; performing a pulsed etching operation to form a polymer liner in the first recess, wherein a top surface of the polymer liner is lower than a top surface of the second passivation layer; and forming a conductive material in the first recess to form a through substrate via.

In conclusion, the present disclosure provides a semiconductor device with a polymer liner and a method of forming the semiconductor device with the polymer liner.

In order to address issues of expansion and deformation of conductive materials at high temperature in a hybrid bonding operation, which may lead to poor yield, the present disclosure provides a semiconductor device with a polymer liner. Specifically, since the polymer liner has great flexibility, the polymer liner can reduce a deformation of the TSV or buffer the negative effect caused by reduce deformation of a TSV. Accordingly, a degree of deformation of the TSV (especially in vertical direction) can be decreased, and a stress concentration in the TSV can be alleviated.

A shape of the polymer liner can be controlled by conditions of the pulsed etching operation discussed with reference to FIG. 2G, such as the first type of pulsed etching operation as depicted in FIG. 2G' or the second type of pulsed etching operation as depicted in FIG. 2G". As a result, the first semiconductor chip 1A with the polymer liner 205 as depicted in FIG. 2K or the first semiconductor chip 2A with the polymer liner 205 as depicted in FIG. 5C can be obtained.

The first semiconductor chip 1A and the first semiconductor chip 2A can be used in a stacked structure to form various types of devices, as shown in FIG. 2M, FIG. 2N, FIG. 3, FIG. 5D, FIG. 5E, or FIG. 6. The aforesaid semiconductor devices or semiconductor structures can be formed by bonding multiple substrates or chips together by hybrid bonding operations.

Further, in pursuit of greater device density, a distance between two adjacent TSVs becomes smaller and smaller. Accordingly, a configuration of a polymer liner can help reduce electrical interference in semiconductor devices having greater device density (for example, the semiconductor device 1D depicted in FIG. 3, or the semiconductor device 2D depicted in FIG. 6), thereby improving device performance.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A method of manufacturing a semiconductor device, comprising:

forming a conductive feature in a first passivation layer over a front side of a first substrate;

forming a second passivation layer over a back side of the first substrate;

forming a first recess in a top surface of the second passivation layer to expose the conductive feature;

performing a pulsed etching operation to form a polymer liner in the first recess, wherein a top surface of the polymer liner is lower than the top surface of the second passivation layer;

forming a conductive material in the first recess to form a through substrate via (TSV); and coupling a second substrate to the first substrate.

2. The method of claim 1, further comprising:

forming an isolation liner in the first recess prior to forming the polymer liner.

3. The method of claim 2, wherein the isolation liner comprises oxide or nitride-based material.

4. The method of claim 1, wherein the performing of the pulsed etching operation comprises: supplying at least one of the following chemicals: $C_4F_8$, $C_4F_6$, and carbon monoxide.

5. The method of claim 1, wherein the performing of the pulsed etching operation comprises altering a bias power with a switching interval that is in a range between $10^{-4}$ s and 10 s.

6. The method of claim 1, wherein the forming of the TSV comprises: performing a planarization operation over the conductive material.

* * * * *